United States Patent
Yoo et al.

(10) Patent No.: US 9,837,584 B2
(45) Date of Patent: Dec. 5, 2017

(54) BLUISH GREEN PHOSPHOR AND LIGHT EMITTING DEVICE PACKAGE INCLUDING THE SAME

(71) Applicant: LG INNOTEK CO., LTD., Seoul (KR)

(72) Inventors: Jae Soo Yoo, Seoul (KR); Jin Sung Kim, Seoul (KR); Jong Woo Yoo, Seoul (KR); Ju A Yoo, Seoul (KR); Seong Wook Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 79 days.

(21) Appl. No.: 14/417,483

(22) PCT Filed: Nov. 13, 2014

(86) PCT No.: PCT/KR2014/010910
§ 371 (c)(1),
(2) Date: Jan. 26, 2015

(87) PCT Pub. No.: WO2015/072766
PCT Pub. Date: May 21, 2015

(65) Prior Publication Data
US 2015/0377429 A1    Dec. 31, 2015

(30) Foreign Application Priority Data

Nov. 13, 2013  (KR) .................. 10-2013-0137879
May 16, 2014  (KR) .................. 10-2014-0058832

(51) Int. Cl.
*C09K 11/08*    (2006.01)
*C09K 11/77*    (2006.01)
*H01L 33/50*    (2010.01)

(52) U.S. Cl.
CPC ........ *H01L 33/504* (2013.01); *C09K 11/7734* (2013.01); *C09K 11/7739* (2013.01); *C09K 11/7792* (2013.01); *H01L 33/502* (2013.01)

(58) Field of Classification Search
CPC .............. H01L 33/504; C09K 11/7732; C09K 11/7739
See application file for complete search history.

(56) References Cited

U.S. PATENT DOCUMENTS 6,069,440 A    5/2000   Shimizu et al.
7,311,858 B2   12/2007  Wang et al.
(Continued)

FOREIGN PATENT DOCUMENTS

KR   10-2011-0016377 A   2/2011
KR   10-2013-0028374 A   3/2013
(Continued)

*Primary Examiner* — Carol M Koslow
(74) *Attorney, Agent, or Firm* — Birch, Stewart, Kolasch & Birch, LLP

(57) ABSTRACT

Embodiments of the present invention provide a bluish green phosphor represented by Formula 1 below. In particular, the bluish green phosphor and a light emitting device package including the same may have improved luminescence characteristics and properties due to influence of cations and anions included in a composition formula:

$$A_aB_bO_cN_dG_eD_fE_g:RE_h \quad \text{[Formula 1]}$$

wherein A is at least one selected from the group consisting of Be, Mg, Ca, Sr, Ba and Ra elements, B is at least one selected from the group consisting of Si, Ge and Sn elements, G is any one of C, Cl, F and Br elements, D is one element or a mixture type of two or more elements selected from Li, Na and K, E is at least one selected from the group consisting of P, As, Bi, Sc, Y and Lu, RE is at least one selected from the group consisting of Eu, Ce, Sm, Er, Yb, Dy, Gd, Tm, Lu, Pr, Nd, Pm and Ho, $0<a\leq15$, $0<b\leq15$, $0<c\leq15$, $0<d\leq20$, $0<e\leq10$, $0<f\leq6$, $0<g\leq6$, and $0<h\leq10$.

6 Claims, 8 Drawing Sheets

(56) References Cited

U.S. PATENT DOCUMENTS

| | | | |
|---|---|---|---|
| 7,794,624 B2 | 9/2010 | Tamaki et al. | |
| 8,512,599 B2 * | 8/2013 | Li | C04B 35/58 252/301.4 F |
| 2011/0279016 A1 | 11/2011 | Li et al. | |
| 2011/0279017 A1 | 11/2011 | Li et al. | |
| 2012/0212122 A1 * | 8/2012 | Thomas | C09K 11/7734 313/498 |

FOREIGN PATENT DOCUMENTS

| | | |
|---|---|---|
| KR | 10-1510124 B1 | 4/2015 |
| WO | WO 2007/096333 A1 | 8/2007 |
| WO | WO 2013/058478 A1 | 4/2013 |

\* cited by examiner

[FIG. 1]
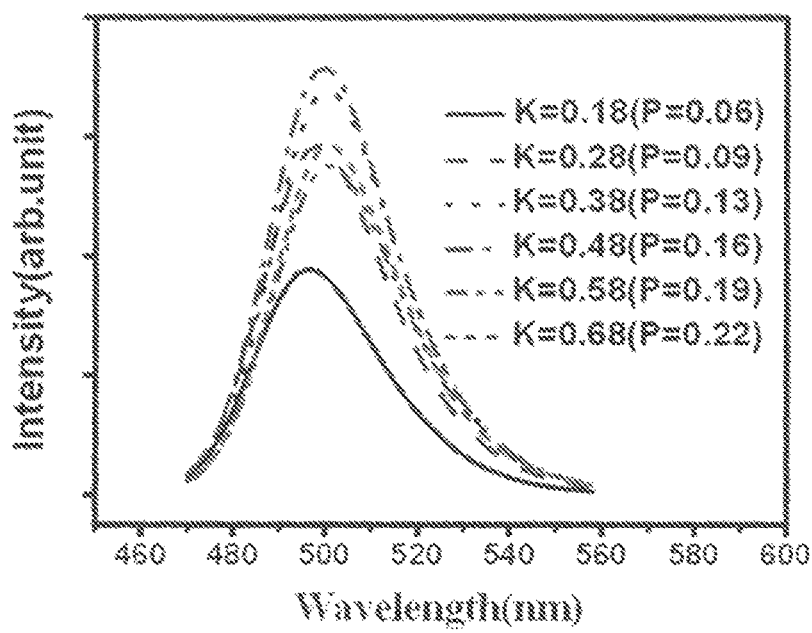
[FIG. 2]
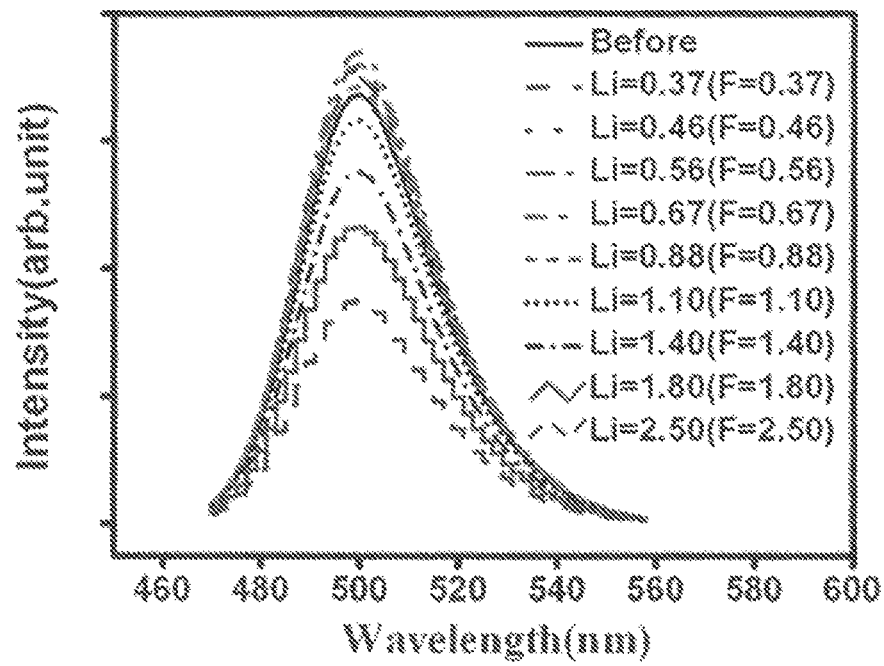

[FIG. 3]
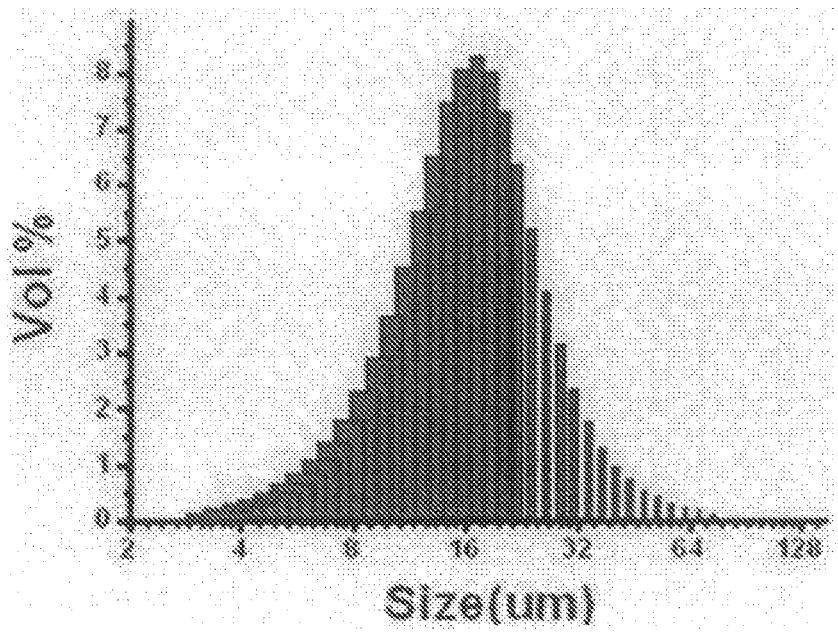
[FIG. 4]
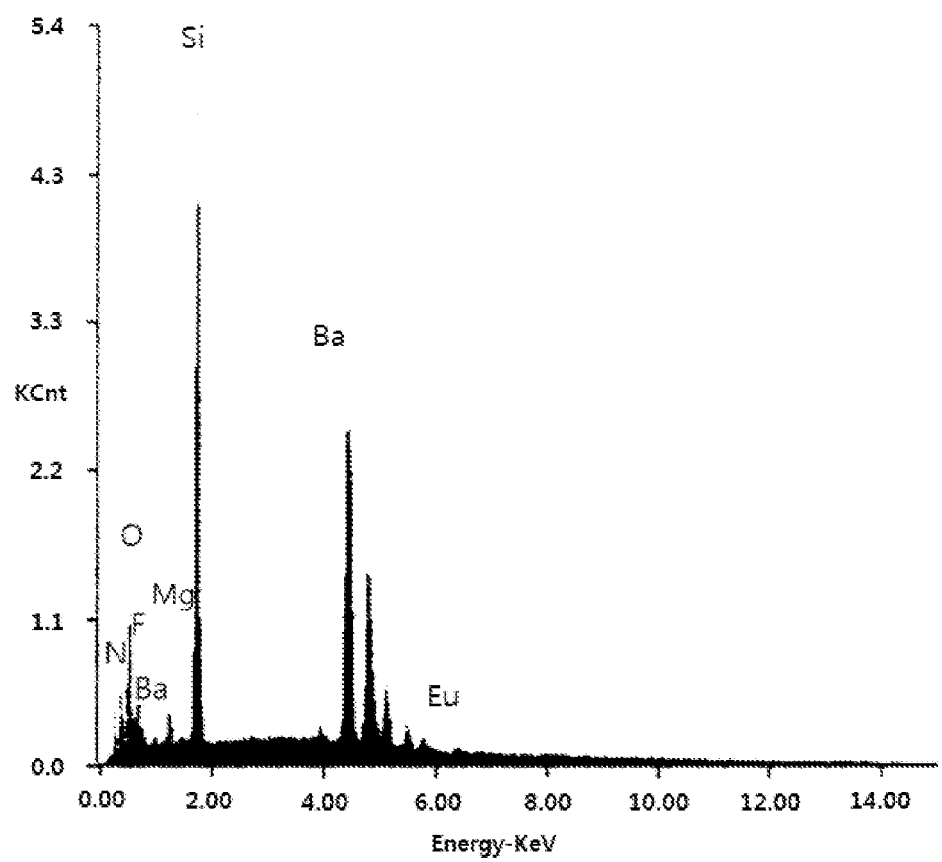

[FIG. 5]
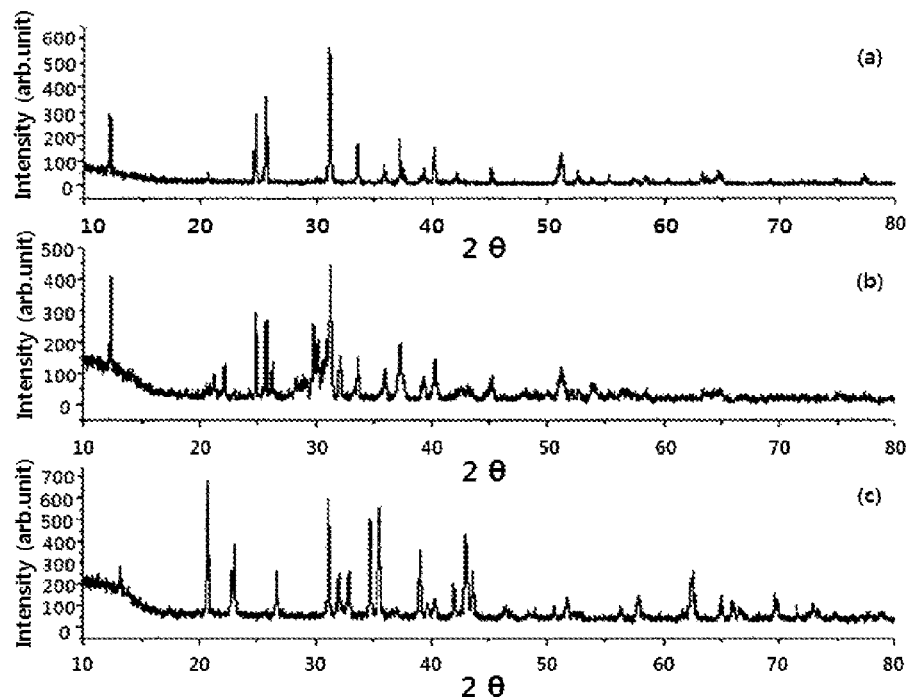
[FIG. 6]
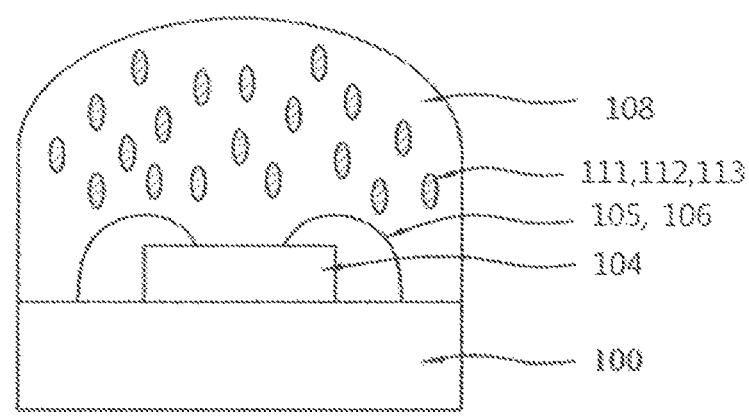

[FIG. 7]
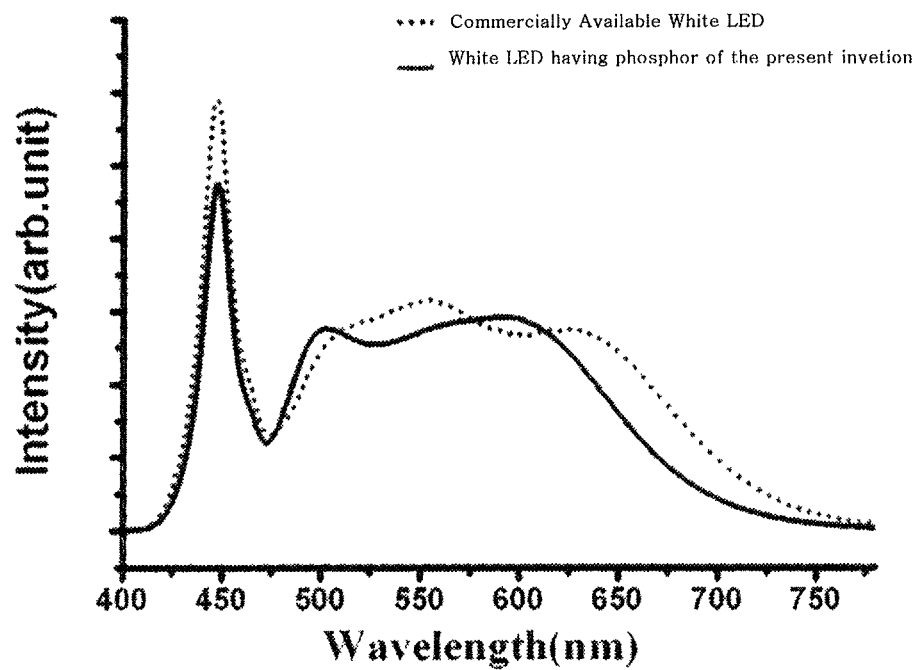
[FIG. 8]
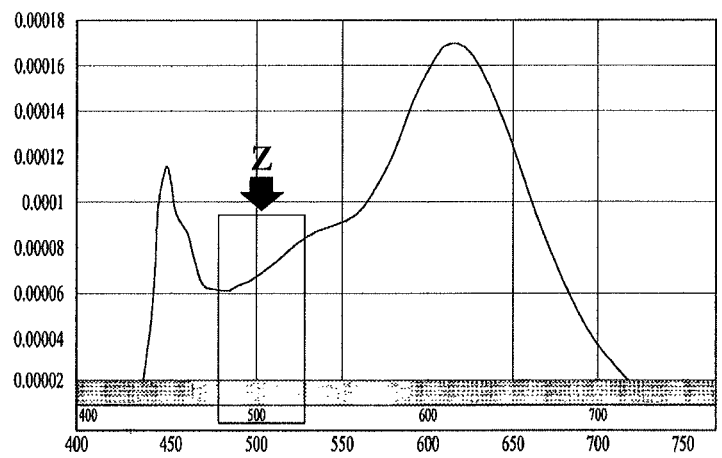

[FIG. 9]
PRIOR ART
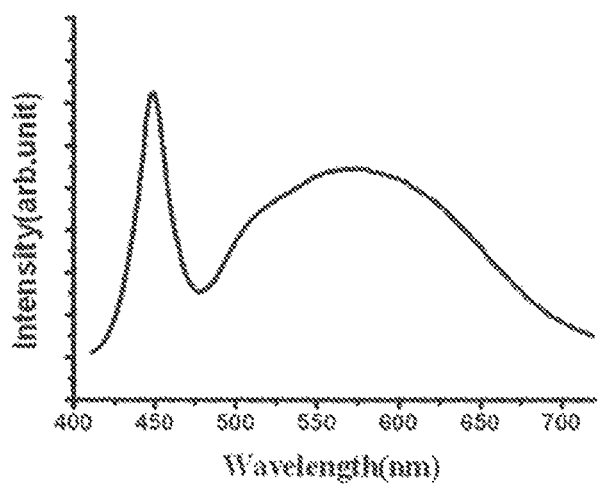
[FIG. 10]
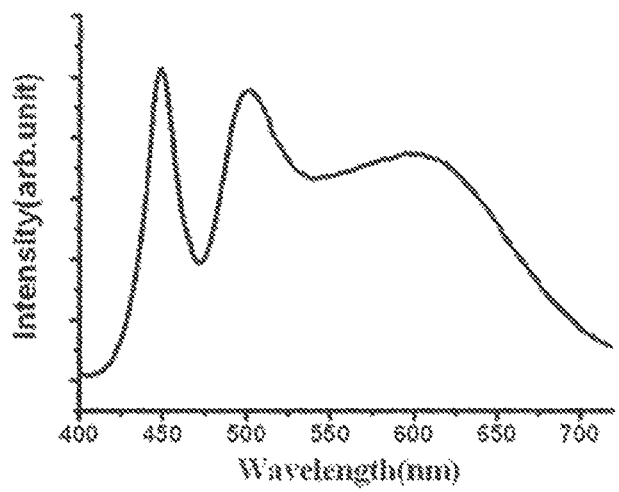
[FIG. 11]
PRIOR ART
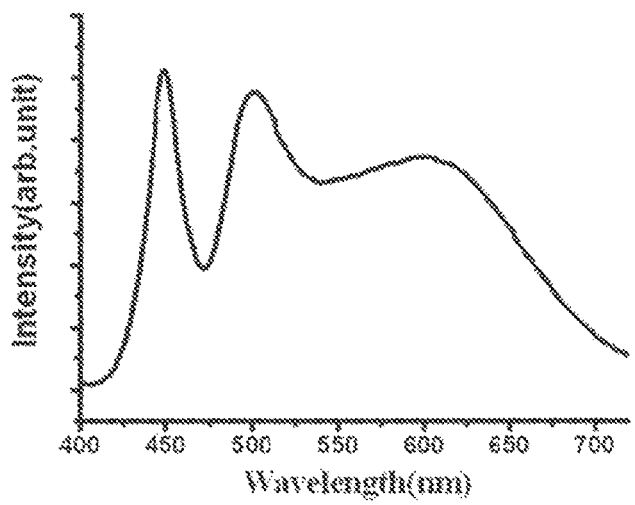

[FIG. 12]
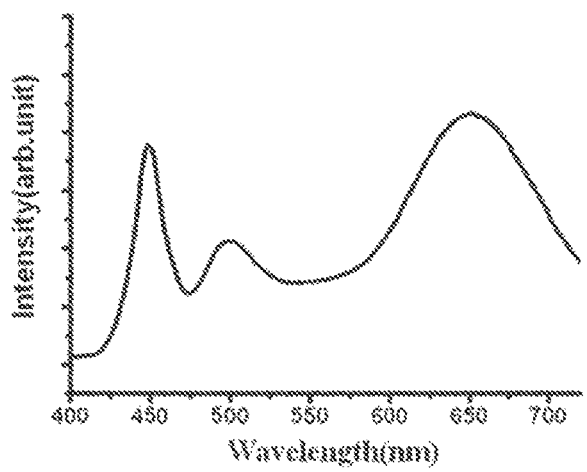
[FIG. 13]
PRIOR ART
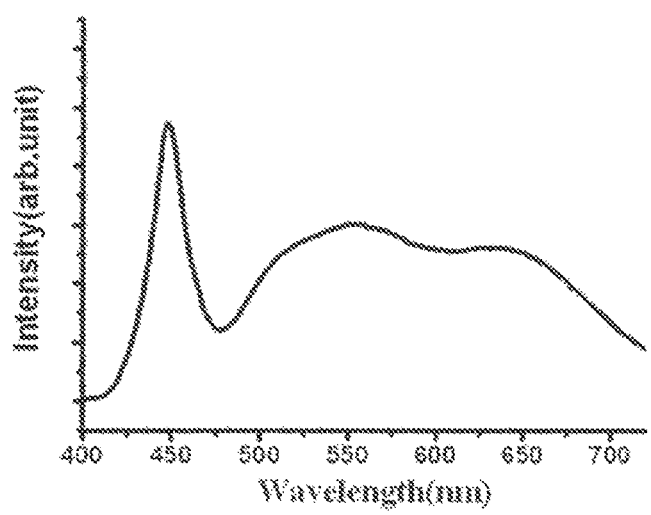
[FIG. 14]
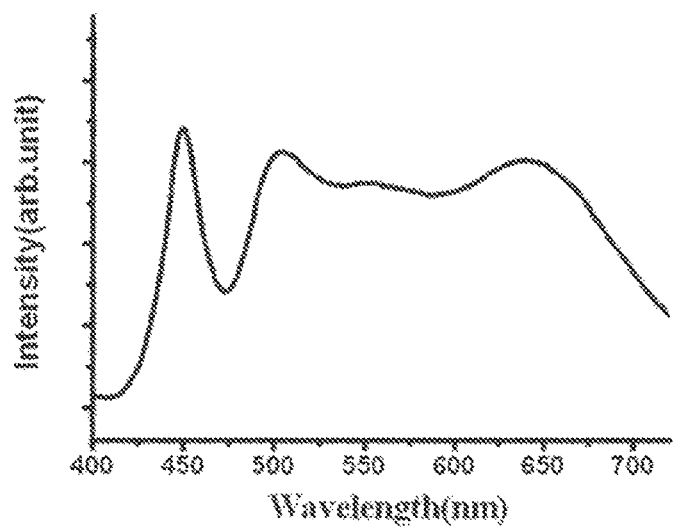

[FIG. 15]
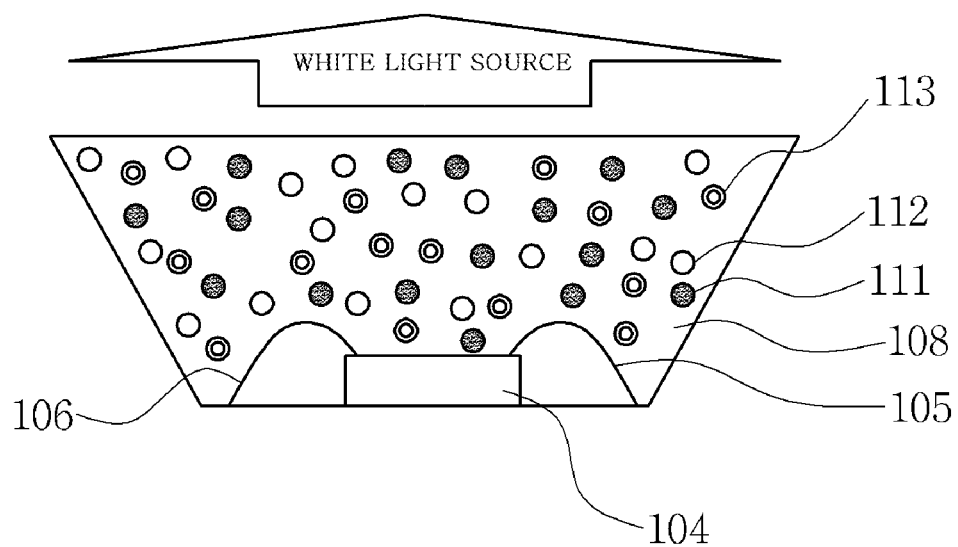
[FIG. 16]
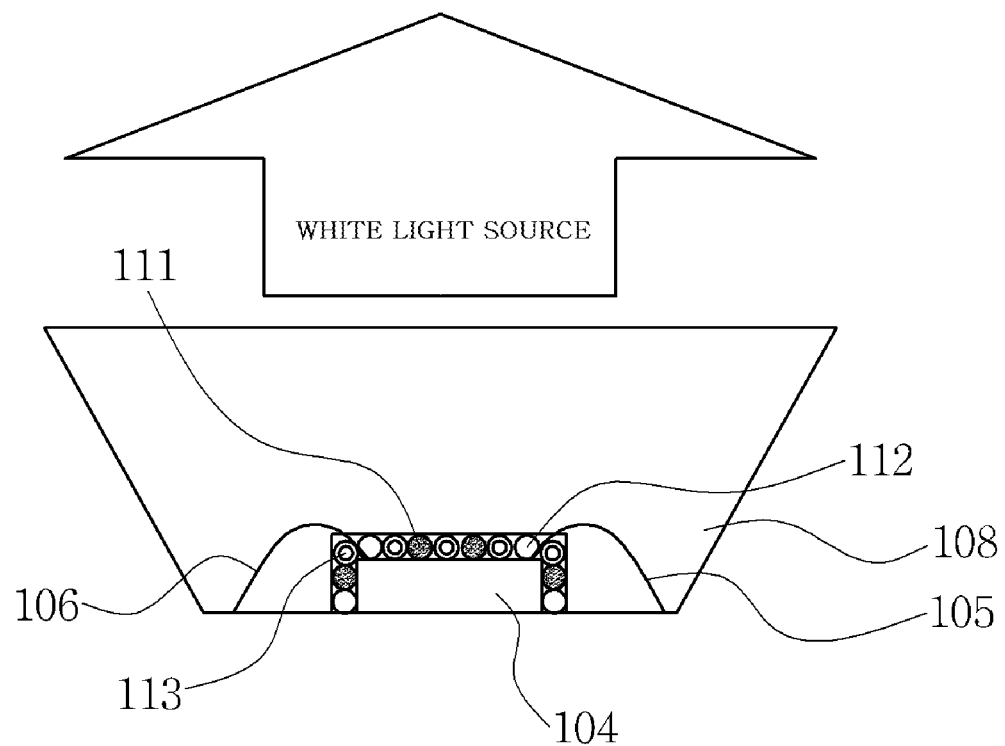

[FIG. 17]
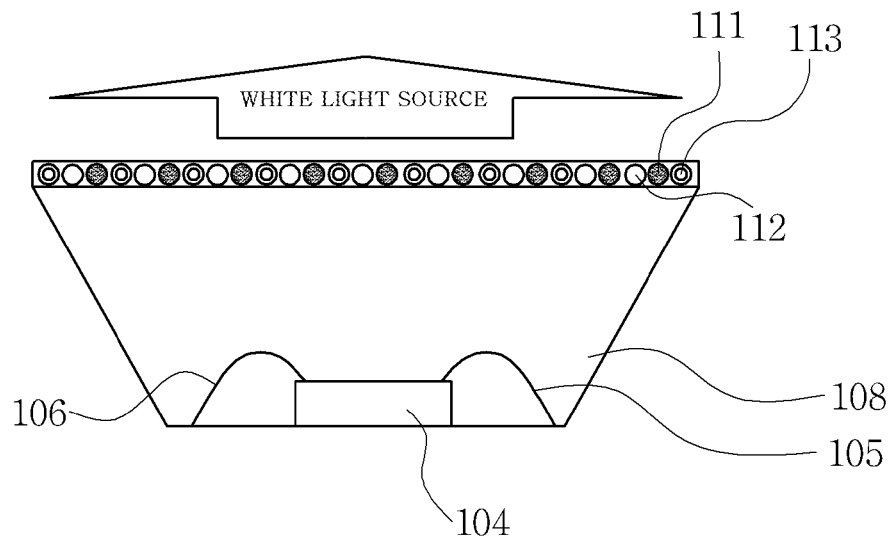
[FIG. 18]
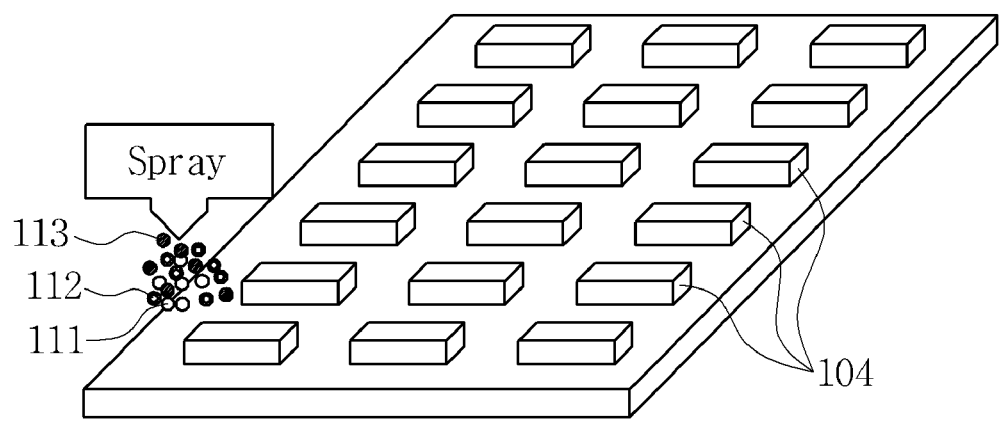

BLUISH GREEN PHOSPHOR AND LIGHT EMITTING DEVICE PACKAGE INCLUDING THE SAME

TECHNICAL FIELD

Embodiments of the present invention relates to a phosphor emitting light of a bluish green wavelength area, and a light emitting device package and lighting apparatus including the same.

BACKGROUND ART

Phosphors function as a vehicle converting energy of an excitation source into energy of visible light and are essential elements to realize a variety of display device images. At the same time, efficiency and color reproduction range of phosphors are important elements directly related to efficiencies and color reproduction ranges of display products and lighting products.

Blue LED devices are diode devices emitting white light. In Blue LED devices, a phosphor emitting blue light as an excitation source to yellow light is coated over a device emitting blue light, to realize white light by mixing blue light emitted from the device and yellow light emitted from the phosphor. That is, LED devices emitting white light use blue light emitted from a device and a second light source, by coating a phosphor over an LED, and, in general, a YAG:Ce phosphor emitting yellow light is coated over a blue LED to generate white light [U.S. Pat. No. 6,069,440].

However, the method has drawbacks such as quantum deficits occurred by using second light, efficiency reduction due to reradiation efficiency, and uneasy color rendering. Therefore, conventional white LED backlights manufactured by combining a blue LED chip and a yellow phosphor express unnatural color due to deficiency of green and red color ingredients and, as such, applications thereof are limited to screens of mobile phones and laptop PCs. Despite such advantages, the method is broadly used due to advantages such as easy driving and dramatically low price.

Meanwhile, regarding white LED, phosphors emitting visible light by being excited by excitation sources having high energy such as ultraviolet light, blue light or the like have been mainly developed. However, conventional phosphors have deteriorated luminance when exposed to an excitation source. Accordingly, recently, as phosphors having reduced luminance deterioration and using silicon nitride-related ceramics as a host crystal, nitrides or phosphors which have a stable crystal structure and may shift excitation light or luminescence to a longer wavelength have attracted attention.

In particular, a CaAlSiN3:Eu red phosphor was developed in 2004 and a β-SiAlON:Eu green phosphor was developed in 2005, as pure nitrides. When such phosphors are combined with a blue LED chip, light having superior color purity is emitted, in particular, small temperature change due to excellent durability is exhibited and, as such, lifespan and reliability of an LED light source may be improved.

A recently developed lighting LED combined after improving a blue LED chip, a Lu3Al5O12:Ce green phosphor, and a CaAlSiN3:Eu red phosphor such that three primary color ingredients may be generated by converting light having a wavelength of 450 nm into a green or yellow phosphor having a wavelength of 520 to 570 nm, or a red phosphor having a wavelength of 650 nm. However, by such combination, it is not easy to maintain color rendering of 90 or more, and a relatively large amount of a red phosphor is required to select a proper white coordinate and, as such, luminous intensity may be lowered.

Meanwhile, research into acid nitride phosphors has been performed since 2009, but lattice defects frequently occur due to bonding of unstable oxygen ions and nitrogen ions and thereby the acid nitride phosphors are not trusted, and, accordingly, commercialization is being delayed.

Accordingly, Korean Patent Pub. Nos. 2011-0016377 and 013-00283742 disclose that a crystal field surrounding Eu ions has a large impact on a central luminescence wavelength of a SiON-based phosphor activated by Eu, and a phosphor has excellent temperature stability and temperature characteristics by optimizing ingredients of cations and anions, and a composition ratio thereof. Here, a primary luminescence wavelength of the phosphor is 540 to 570 nm.

However, until now, it has been difficult to determine how a crystal structure change of such an acid nitrides phosphor and light properties are connected [International Publication No. 2007/096333 and Chemistry of Materials, 25, pages 1852 to 1857, 2013].

Accordingly, the present inventors tried to resolve the conventional problems and, as a result, confirmed that when ingredients of cations and anions, and a composition ratio thereof are optimized, a highly efficient and stable bluish green luminescence phosphor may be provided by minimizing lattice defects in a homogeneous phase and a multi-phase crystal structure at thermodynamic synthetic temperature, and, when a white LED obtained by coating a mixed green phosphor and red phosphor over a conventional blue LED is prepared, a white LED device is manufactured by mixing a bluish green luminescence phosphor according to the present invention therewith and thereby a color rendering index and luminous intensity of a manufactured white LED device are improved, thus completing the present invention.

DISCLOSURE

Technical Problem

An object of the present invention devised to solve the problem lies in a bluish green phosphor having improved light intensity and thermal stability by optimal combination of a composition ratio of included cations and anions, and a light emitting device package including the same, luminance and a color rendering index of which are improved.

Technical Solution

The object of the present invention can be achieved by providing a bluish green phosphor represented by Formula 1 below:

  [Formula 1]

wherein A is at least one selected from the group consisting of Be, Mg, Ca, Sr, Ba and Ra elements, B is at least one selected from the group consisting of Si, Ge and Sn elements, G is any one of C, Cl, F and Br elements, D is at least one of Li and K, E is at least one selected from the group consisting of P, As, Bi, Sc, Y and Lu, RE is at least one selected from the group consisting of Eu, Ce, Sm, Er, Yb, Dy, Gd, Tm, Lu, Pr, Nd, Pm and Ho, $0<a\leq15$, $0<b\leq15$, $0<c\leq15$, $0<d\leq20$, $0<e\leq10$, $0<f\leq6$, $0<g\leq6$, and $0<h\leq10$.

In another aspect of the present invention, provided herein is a bluish green phosphor represented by Formula 2 below:

  [Formula 2]

wherein A is at least one selected from the group consisting of Be, Mg, Ca, Sr, Ba and Ra elements, B is at least one selected from the group consisting of Si, Ge and Sn elements, G is any one of C, Cl, F and Br elements, RE is at least one selected from the group consisting of Eu, Ce, Sm, Er, Yb, Dy, Gd, Tm, Lu, Pr, Nd, Pm and Ho, 0<a≤15, 0<b≤15, 0<c≤15, 0<d≤20, 0<e≤10, 0<h≤10, 0<w≤6, and 0<z≤2.

w may satisfy 0.2≤w≤0.6.

In another aspect of the present invention, provided herein is a bluish green phosphor represented by Formula 3 below:

$$Ba_xMg_yB_bO_cN_dG_eLi_vK_wP_z:RE_h$$ [Formula 3]

wherein B is at least one selected from the group consisting of Si, Ge and Sn elements, G is any one of C, Cl, F and Br elements, RE is at least one selected from the group consisting of Eu, Ce, Sm, Er, Yb, Dy, Gd, Tm, Lu, Pr, Nd, Pm and Ho, 0<b≤15, 0<c≤15, 0<d≤20, 0<e≤10, 0<h≤10, 0.5<x≤15, 0<y≤10, 0.5<x+y≤15, 0<v≤6, 0<w≤6, and 0<z≤2.

In one embodiment of Formula 3, w may satisfy 0.2≤w≤0.6 and v may satisfy 0<v≤1.4.

In one embodiment of the bluish green phosphor, x may satisfy 2≤x≤5, y may satisfy 0<y≤2, and a value of x+y may satisfy 2<x+y≤7.

A ratio of y to x, namely, a value of y/x may be as follows:

0<y/x≤2

In the embodiment described above, the bluish green phosphor may use a wavelength area of 300 nm to 500 nm as an excitation source, and may have a luminescence wavelength of 460 nm to 540 nm. In addition, a central wavelength of the luminescence wavelength may be 490 nm to 500 nm.

In the embodiment described above, the bluish green phosphor may have a particle size distribution a D10 particle size distribution of 1 μm or more and less than 10 μm, a D50 particle size distribution of 10 μm or more and less than 30 μm, and a D90 particle size distribution of 20 μm or more and less than 70 μm.

In another aspect of the present invention, provided herein is a light emitting device package including at least one light emitting device; and a molding part disposed on the at least one light emitting device and including a phosphor composition.

In the embodiment of the light emitting device package, the phosphor composition may include the bluish green phosphor of the embodiment described above.

The at least one light emitting device may emit light of an ultraviolet wavelength area or a blue light wavelength area.

The phosphor composition may further include any one of a green or yellow phosphor, and a red phosphor.

The molding part may include a resin part and the bluish green phosphor may be included in an amount of 0.1 or more and 99 or less parts by weight based on 100 parts by weight of the resin part.

One embodiment of the light emitting device package may have a color rendering index (CRI) of 60 Ra or more and 99 Ra or less at a color temperature (CCT) of 2,000 to 10,000 K.

Any one of the green and yellow phosphors may have a central luminescence wavelength of 510 nm to 570 nm, and the red phosphor may have a central luminescence wavelength of 610 nm to 670 nm.

Any one of the green and yellow phosphors may be $(Lu,Gd)_3(Al,Ga)_5O_{12}:Ce^{3+}$ or $(Y,Gd)_3(Al,Ga)_5O_{12}:Ce^{3+}$.

The red phosphor may be $(Sr,Ca)AlSiN_3:Eu^{2+}$ or $(Sr,Ba,Ca)_2Si_5N_8:Eu^{2+}$.

The phosphor composition may be included in the molding part as a dispersive type, a conformal type, or a remote type.

Any one of the green and yellow phosphors may have a central luminescence wavelength of 525 nm to 535 nm, the red phosphor may have a central luminescence wavelength of 625 nm to 635 nm, and the bluish green phosphor may have a weight ratio as follows:

0 wt %<M<50 wt % wherein M={mb/(mb+mg+mr)}*100, mb is the weight of the bluish green phosphor, mg is the weight of any one of the green and yellow phosphors, and mr is the weight of the red phosphor.

Any one of the green and yellow phosphors may have a central luminescence wavelength of 520 nm to 530 nm, the red phosphor may have a central luminescence wavelength of 650 nm to 665 nm, and the bluish green phosphor may have a weight ratio as follows:

0 wt %<M<20 wt % wherein M={mb/(mb+mg+mr)}*100, mb is the weight of the bluish green phosphor, mg is the weight of any one of the green and yellow phosphors, and mr is the weight of the red phosphor.

Any one of the green and yellow phosphors may have a central luminescence wavelength of 535 nm to 545 nm, the red phosphor may have a central luminescence wavelength of 650 nm to 665 nm, and the bluish green phosphor may have a weight ratio as follows:

0 wt %<M<40 wt % wherein M={mb/(mb+mg+mr)}*100, mb is the weight of the bluish green phosphor, mg is the weight of any one of the green and yellow phosphors, and mr is the weight of the red phosphor.

When the bluish green phosphor has a weight ratio of 5 wt % to 35 wt %, a color rendering index (CRI) of the bluish green phosphor may be 90 Ra or more and 99 Ra or less.

In another aspect of the present invention, provided herein is a light emitting device package which may have luminescence wavelength peaks such as a first peak at 440 nm to 460 nm, a second peak at 490 nm to 510 nm, a third peak at 530 nm to 540 nm, and a fourth peak at 650 nm to 655 nm.

In another aspect of the present invention, provided herein is lighting apparatus including the light emitting device package of the embodiment described above as a light source.

Advantageous Effects

A bluish green phosphor according to embodiments of the present invention may have improved light intensity and temperature stability by an optimal combination of a composition ratio, and a light emitting device package including the same also have improved luminance and color rendering index.

DESCRIPTION OF DRAWINGS

FIG. 1 illustrates luminescence spectra of embodiments in which the amount of K in a composition of Formula 2 is varied.

FIG. 2 illustrates luminescence spectra of embodiments in which the amount of Li in a composition of Formula 3 is varied.

FIG. 3 illustrates particle size distribution (PSA) of a bluish green phosphor as one embodiment.

FIG. 4 is an ingredient distribution graph illustrating an X-ray fluorescence analysis result of a bluish green phosphor as one embodiment.

FIGS. 5(a), 5(b) and 5(c) illustrate XRD data of a bluish green phosphor as embodiments.

FIG. 6 illustrates a light emitting device package as one embodiment.

FIG. 7 illustrates a comparison result of light spectra of a white LED device including a bluish green phosphor and a commercially available white LED device, at a color rendering index (CRI) of 90 based on 5000 K as one embodiment.

FIG. 8 illustrates light spectra of a white LED device including a bluish green phosphor and a commercially available white LED device, at a color rendering index (CRI) of 80 at a basis of 5000 K.

FIGS. 9, 11 and 13 each illustrate a light emitting spectrum of a light emitting device package of a comparative example.

FIGS. 10, 12 and 14 each illustrate a light emitting spectrum of a light emitting device package of one embodiment.

FIGS. 15 to 18 each illustrate a light emitting device package as one embodiment.

BEST MODE

Reference will now be made in detail to the preferred embodiments of the present invention, examples of which are illustrated in the accompanying drawings.

In the following description of the embodiments, it will be understood that, when each element is referred to as being "on" or "under" another element, it can be "directly" on or under another element or can be "indirectly" formed such that an intervening element is also present. In addition, terms such as "on" or "under" should be understood on the basis of the drawings.

Terms such as "first", "second", "upper portion", and "lower portion" are not intended to imply that the elements so described must have a given physical or logical relation, or sequence, and are used merely for the purpose of distinguishing one element from another element.

In the drawings, the thicknesses of layers and regions are exaggerated, omitted, or schematically illustrated for clarity. In addition, the sizes of elements do not reflect their actual sizes completely.

A bluish green phosphor according to embodiments of the present invention may be represented by Formula 1 below:

$A_aB_bO_cN_dG_eD_fE_g:RE_h$ [Formula 1]

wherein A is at least one selected from the group consisting of Be, Mg, Ca, Sr, Ba and Ra elements, B is at least one selected from the group consisting of Si, Ge and Sn elements, G is any one of C, Cl, F and Br elements, D is one element or a mixture type of two or more elements selected from Li, Na and K, E is at least one selected from the group consisting of P, As, Bi, Sc, Y and Lu, RE is at least one selected from the group consisting of Eu, Ce, Sm, Er, Yb, Dy, Gd, Tm, Lu, Pr, Nd, Pm and Ho, $0<a\leq15$, $0<b\leq15$, $0<c\leq15$, $0<d\leq20$, $0<e\leq10$, $0<f\leq6$, $0<g\leq6$, and $0<h\leq10$.

In one embodiment of the bluish green phosphor according to a composition of Formula 1, element A may include Ba.

For example, one embodiment of the bluish green phosphor according to Formula 1 may be represented by a composition formula of $Ba_aSi_bO_cN_dF_eK_fP_g:Eu_h$. Here, a may satisfy $0<a\leq15$, b may satisfy $0<b\leq15$, c may satisfy $0<c\leq15$, d may satisfy $0<d\leq20$, e may satisfy $0<e\leq10$, f may satisfy $0<f\leq6$, g may satisfy $0<g\leq6$, and h may satisfy $0<h\leq10$.

In Formula 1, B may be Si and RE may be Eu.

In addition, in the composition of Formula 1, element A may further include Mg in addition to Ba.

By further adding Mg in addition to Ba to the composition of Formula 1, lattice coupling of a phosphor becomes strong and thereby superior light characteristics may be exhibited.

For example, the bluish green luminescence phosphor according to the composition formula may minimize lattice defects in a single phase crystal and, as such, may accomplish high efficiency and improved temperature stability, by transferring $Mg^{2+}$ ions (having an atomic radius of 160 pm), which have a smaller radius than $Ba^{2+}$ ions, to lattices of $Ba^{2+}$ cathode ion sites.

When element A of Formula 1 includes Ba and Mg, a molar ratio of Ba may be greater than 0 and 15 or less, and a molar ratio of Mg ions may be greater than 0 and 10 or less. For example, a molar ratio of Ba may be greater than 0.5 and 14.5 or less, and a molar ratio of Mg, namely, y, may be greater than 0 and 2 or less.

The bluish green phosphor of the embodiment may be represented by Formula 2 below.

$A_aB_bO_cN_dG_eK_wP_z:RE_h$ [Formula 2]

In Formula 2, A is at least one selected from the group consisting of Be, Mg, Ca, Sr, Ba and Ra elements, B is at least one selected from the group consisting of Si, Ge and Sn elements, G is any one of C, Cl, F and Br elements, RE is at least one selected from the group consisting of Eu, Ce, Sm, Er, Yb, Dy, Gd, Tm, Lu, Pr, Nd, Pm and Ho, $0<a\leq15$, $0<b\leq15$, $0<c\leq15$, $0<d\leq20$, $0<e\leq10$, $0<h\leq10$, $0<w\leq6$, and $0<z\leq2$.

In the embodiment of Formula 2, A may include Ba and Mg.

That is, the bluish green phosphor represented by Formula 2 may have improved crystallinity by controlling a composition ratio of Ba and Mg.

In addition, cations (K, Li) and anions (P) may be added to a composition formula of a phosphor including Ba and Mg as a composition of Formula 2, so as to stabilize lattice coupling generated by combination of N ions and O ions as anions, and the phosphor of the embodiment may have improved light properties by optimizing a composition ratio of cations and anions.

FIG. 1 illustrates luminescence wavelength spectra of embodiments, in which K content is varied, of a bluish green phosphor represented by a composition of Formula 2.

FIG. 1 may illustrates embodiments, in which A is Ba and Mg, B is Si, G is F and RE is Eu, of Formula 2.

Referring to FIG. 1, a luminous intensity value increases with increasing amount of K, but, when the amount of K is greater than 0.6, luminous intensity reduced again.

That is, lattice coupling strength of the bluish green phosphor increases due to addition of K and thereby luminous intensity increases. However, when K is included in an amount of greater than 0.6, K may function as impurities and thereby properties of phosphor may be deteriorated.

In the composition of Formula 2, a molar ratio of K, namely, w, may be greater than 0 and 6 or less. Referring to FIG. 1, for example, a molar ratio of K, namely, w may be 0.2 or more and 0.6 or less.

Here, a molar ratio of P may be greater than 0 and 2 or less and, for example, z may be greater than 0 and 0.2 or less.

Another embodiment of the bluish green phosphor of the embodiment may be represented by a composition of Formula 3 below.

$Ba_xMg_yB_bO_cN_dG_eLi_vK_wP_z:RE_h$ [Formula 3]

In Formula 3, B is at least one selected from the group consisting of Si, Ge and Sn elements, G is any one of C, Cl, F and Br elements, RE is at least one selected from the group consisting of Eu, Ce, Sm, Er, Yb, Dy, Gd, Tm, Lu, Pr, Nd, Pm and Ho, $0<b\leq15$, $0<c\leq15$, $0<d\leq20$, $0<e\leq10$, $0<h\leq10$, $0.5<x\leq15$, $0<y\leq10$, $0.5<x+y\leq15$, $0<v\leq6$, $0<w\leq6$, and $0<z\leq2$.

For example, in the embodiment Formula 3, B may be Si and C may be F.

In addition, in Formula 3, the amount of Li may be greater than 0 and 6 or less, and, for example, a molar ratio of Li, namely, v, may be greater than 0 and 1.4 or less. In addition, In particular, v may satisfy $0<v\leq1$.

FIG. 2 illustrates luminescence characteristics of embodiments of the bluish green phosphor according to the amount of Li.

FIG. 2 illustrates luminescence characteristics of embodiments, in which the amount of Li is varied, of the bluish green phosphor represented by the composition of Formula 3.

Referring to FIG. 2, light characteristics are improved with increasing amount of Li in a bluish green phosphor, but it can be confirmed that luminous intensity reduces when Li is included in a molar ratio of greater than a 1.4.

That is, by including Li, lattice coupling strength of a bluish green phosphor becomes strong and thereby luminous intensity increases. However, when Li is included in an amount of greater than 1.4, Li functions as impurities and, as such, properties of the phosphors of the embodiments may be deteriorated.

In addition, in the composition of Formula 3, a molar ratio of K, namely, w, may be greater than 0 and 6 or less, and, for example, w may be 0.2 or more and 0.6 or less.

Here, a molar ratio of P, namely, z, may be greater than 0 and 2 or less, and, for example, z may be greater than 0 and 0.2 or less.

For example, embodiments of the bluish green phosphor represented by the composition of Formula 3 may be
$Ba_xMg_ySi_bO_cN_dF_eK_wP_zLi_v:Eu_h$ where $0.5<x\leq15$, $0<y\leq2$, $5\leq b\leq15$, $2\leq c\leq7$, $5\leq d\leq20$, $0<e\leq1$, and $0<h\leq1$. In addition, $0<v\leq1.4$, $0<w\leq0.6$, and $0<z\leq0.2$.

By including Li and K as cations and P element as the composition of Formula 3, the bluish green phosphor of the embodiment may have superior light properties and thermal stability.

In Formula 3, a ratio of y, namely, a molar ratio of Mg, to x, namely, a molar ratio of Ba, may satisfy $0<y/x\leq2$. When a molar ratio of the two elements, namely, y/x, exceeds 2, luminescence characteristics outside the luminescence characteristics of the bluish green phosphor may be exhibited.

For example, a value of y/x may satisfy $0<y/x\leq0.4$ and, when a value of y/x exceeds 0.4, a reduction width of a luminous intensity value may be increased. In addition, for example, a value of y/x may satisfy $0<y/x\leq0.1$.

For example, embodiments of the bluish green phosphor represented by Formula 3 may include a variety of embodiments in which the content ratios of Ba and Mg are controlled.

In Formula 3, a molar ratio of Ba, namely, x, may satisfy $0.5<x\leq2.5$, and a molar ratio of Mg, namely, y, may satisfy $0<y\leq2$. In particular, a molar ratio of Mg, namely, y, may satisfy $0<y\leq0.5$. Here, a value of x+y may satisfy $0.5<x+y\leq2.5$.

In addition, in one embodiment according to Formula 3, a molar ratio of Ba, namely, x, may satisfy $1.5<x\leq3.5$, a molar ratio of Mg, namely, y, may satisfy $0<y\leq2.5$. In particular, a molar ratio of Mg, namely, y, may satisfy $0<y\leq0.8$. Here, a value of x+y may satisfy $1.5<x+y\leq3.5$.

In addition, in another embodiment according to Formula 3, a molar ratio of Ba, namely, x, may satisfy $3.5<x\leq7.5$, and a molar ratio of Mg, namely, y, may satisfy $0<y\leq5$. In particular, a molar ratio of Mg, namely, y, may satisfy $0<y\leq1.7$. A value of x+y may satisfy $3.5<x+y\leq7.5$.

In addition, in yet another embodiment according to Formula 3, a molar ratio of Ba, namely, x, may satisfy $7.5<x\leq14.5$, and a molar ratio of Mg, namely, y, may satisfy $0<y\leq10$. In particular, a molar ratio of Mg, namely, y, may satisfy $0<y\leq2.5$. Here, a value of x+y may satisfy $7.5<x+y\leq14.5$.

One embodiment of a bluish green phosphor represented by Formulas 1 to 3 described above may be any one selected from the group consisting of
$Ba_{2.84}Mg_{0.11}Si_{5.05}O_{3.4}N_{8.33}F_{0.22}K_{0.15}P_{0.05}:Eu_{0.15}$,
$Ba_{2.84}Mg_{0.11}Si_{5.05}O_{3.4}N_{8.33}F_{0.22}K_3P:EU_{0.15}$,
$Ba_{1.84}Mg_{0.11}Si_{4.95}O_{2.29}N_{8.73}F_{0.22}K_{0.1}P_{0.03}:Eu_{0.15}$,
$Ba_{1.84}Mg_{0.11}Si_{4.05}O_{2.20}N_{8.73}F_{0.22}KP_3:EU_{0.15}$,
$Ba_{2.84}Mg_{0.11}Si_{5.95}O_{3.4}N_{8.33}F_{0.22}K_{0.5}P_{0.1}Li_{0.2}:Eu_{0.15}$,
$Ba_{1.84}Mg_{0.11}Si_{4.95}O_{2.395}N_{8.6}F_{0.32}\ K_{0.3}P_{0.1}Li_{0.1}:Eu_{0.15}$,
$Ba_{1.84}Mg_{0.11}Si_{4.95}O_{2.395}N_{8.6}F_{1.22}K_{0.3}P_{0.1}Li_{0.2}:Eu_{0.15}$,
$Ba_{1.84}Mg_{0.11}Si_{4.95}O_{2.395}N_{8.6}F_{0.42}\ K_{0.3}P_{0.1}Li_{0.2}:Eu_{0.15}$,
$Ba_{2.79}Mg_{0.11}Si_6O_{3.62}N_8F_{0.66}\ K_{0.465}P_{0.155}Li_{0.66}:Eu_{0.15}$,
$Ba_{5.32}Mg_{0.53}Si_{12.1}O_{3.3}N_{8.2}F_{0.67}\ K_{0.48}P_{0.16}Li_{0.67}:Eu_{0.15}$, and
$Ba_{11.55}Mg_{1.3}Si_{2.1}O_{5.3}N_{1.4}F_{0.67}K_{0.48}P_{0.16}Li_{0.67}:Eu_{0.15}$.

The bluish green phosphor of the embodiment described above represented by Formulas 1 to 3 may have particle size distribution a D10 particle size distribution of 1 μm or more and less than 10 μm, a D50 particle size distribution of 10 μm or more 30 μm, and a D90 particle size distribution of 20 μm or more 70 μm.

FIG. 3 illustrates a particle size distribution measurement result with particle size analyzer (PSA) of one embodiment of the bluish green luminescence phosphor. The embodiment of the bluish green luminescence phosphor may have particle size distribution (PSA) a D10 particle size distribution of 1 μm or more and less than 10 μm, a D20 particle size distribution of 5 μm or more and less than 15 μm, a D30 particle size distribution of 10 μm or more and less than 20 μm, a D40 particle size distribution of 10 μm or more and less than 25 μm, a D50 particle size distribution of 10 μm or more and less than 30 μm, a D60 particle size distribution of 15 μm or more and less than 30 μm, a D70 particle size distribution of 15 μm or more and less than 35 μm, a D80 particle size distribution of 20 μm or more and less than 40 μm, a D90 particle size distribution of 20 μm or more and less than 70 μm, and a D100 particle size distribution of 25 μm or more and less than 100 μm.

In particular, at D50, the particle size is 10 μm or more and less than 30 μm and thus may satisfy particle size distribution required in application to LED packages. Meanwhile, when the particle size exceeds 30 μm at D50, precipitation may occur during LED package application.

Accordingly, the bluish green luminescence phosphor of the embodiment may be used as a phosphor suitable for an LED package.

FIG. 4 is an ingredient distribution graph showing an X-ray fluorescence analysis result of the bluish green phosphor as one embodiment.

It can be confirmed that the bluish green phosphor of the embodiment includes Ba, Mg, Si, O, N, F, Eu as illustrated in FIG. 4, and includes K, P and Li elements as shown in an X-ray analysis result of an experimental example described below.

The bluish green phosphors of the embodiments described above include $Mg^{2+}$ ions having a relatively small ionic radius and, according to a coupling ratio of $Ba^{2+}$ and $Mg^{2+}$, a central luminescence wavelength and a crystal structure of a synthesized phosphor may be controlled. In addition, a phosphor having excellent luminescence efficiency, and improved temperature stability and reliability may be provided.

FIG. 5 illustrates XRD comparison results of embodiments of the bluish green phosphor represented by the composition of Formula 3 and phosphors having different compositions.

In FIG. 5, (a) is a comparison example, a composition formula of which does not include cations such as Li and K, and P, and (c) is a comparative example does not include Li, K and P as (a) and Mg.

For example, in an experiment of FIG. 5, the composition formulas may be as follows: (a) $Ba_{2.84}Mg_{0.11}Si_{5.95}O_{3.4}N_{8.33}F_{0.22}$:$Eu_{0.15}$, (b) $Ba_{2.84}Mg_{0.11}Si_{5.9}O_{3.64}N_{7.93}F_{0.67}K_{0.48}P_{0.16}Li_{0.67}$:$EU_{0.15}$, and (c) $Mg_{2.95}Si_{5.95}O_{3.4}N_{8.33}F_{0.22}Eu_{0.15}$.

In the bluish green phosphor of the embodiment, some Ba ions may be substituted with Mg ions at cathode ion sites and anions may additionally use halogen ions, to minimize lattice defects which may occur during processing.

Accordingly, as illustrated in FIG. 5, it can be confirmed that crystallinity is improved by including cations and anions. Here, reflexibility at a (1,1,1) face with respect to a main peak of crystallinity, namely, a(3,1,1) face may be increased by 30%.

On the other hand, the crystal structure of the $Mg_{2.95}Si_{5.95}O_{3.4}N_{8.33}F_{0.22}$:$Eu_{0.15}$ phosphor of FIG. 5(c) includes 20% or more of Mg ions and thereby dramatic change, which is not observed in the bluish green phosphor of the embodiment, such as new phase formation and the like may be confirmed.

Accordingly, it can be confirmed that the bluish green phosphor of the embodiment may realize maximum luminescence strength when Mg ions are included in an amount of less than 15% and exhibits improved crystallinity when cations and anions are added.

A method of preparing the bluish green phosphor of the embodiment may include: (1) preparing a starting salt for phosphor preparation by mixing after quantifying a metal salt including divalent metal ions of alkaline earth metals; Si ions; and Eu ions; and (2) heat treating the mixed starting salt at 1000° C. to 1600° C. under a reducing atmosphere controlled with reducing gas of 100 to 1000 sccm.

In step (1) of the method of preparing the phosphor of the embodiment, the metal element as a starting salt to form a bluish green luminescence phosphor lattice may optimize a phosphor structure and characteristics by combining elements having different ionic radii among divalent metal ions of alkaline earth metals.

Accordingly, the divalent metal ions of alkaline earth metals preferably includes only $Ba^{2+}$ ions, or $Mg^{2+}$ ions having a relatively small ionic radius with the $Ba^{2+}$ ions.

According to a coupling ratio of $Ba^{2+}$ and $Mg^{2+}$, a central luminescence wavelength and a crystal structure of a synthesized phosphor may be improved, and, accordingly, a bluish green phosphor having excellent efficiency, and superior temperature stability and reliability may be provided.

Here, a compound to generate oxides of metal elements is not specifically limited, but may be preferably at least one alkaline earth metal compound selected from alkaline earth metals, which may be easily obtained in a highly pure compound state, may be easily dealt in the atmosphere and are relatively cheap, such as carbonates, oxalates, nitrates, sulfates, acetates, oxides, peroxides, and hydroxides.

For example, the alkaline earth metals may be carbonates, oxalates, oxides, hydroxides and fluorides. In particular, the alkaline earth metal compound may be used in a carbonate type. In addition, a phase of the alkaline earth metals compound is not specifically limited, but may be a powder phase to prepare a phosphor having excellent performance.

In Formula 1 described above, a bluish green phosphor may be prepared when the element A as an alkaline earth metals is used in a molar concentration of greater than 0 and 15 or less, and molar concentration of the element A may be the same as or different from molar concentration of oxygen.

As a starting salt to form the bluish green luminescent phosphor lattice of the embodiment, at least one selected from the group consisting of Si, Ge and Sn may be used. For example, a silicon (Si) compound may be used in a molar concentration of greater than 0 and 15 or less. Here, the silicon compound is not specifically limited so long as the silicon compound may be used in a conventional phosphor composition, but the silicon compound may be preferably silicon nitride ($Si_3N_4$), silicon diimide ($Si(NH)_2$) or silicon oxide ($SiO_2$) to prepare a high performance phosphor.

In the phosphor having a composition of Formula 1 of the embodiment, the phosphor may be prepared considering a concentration of a nitrogen element according to a molar ratio of a silicon compound corresponding to the element B.

The bluish green phosphor of the embodiment may use at least one selected from the group consisting of Eu, Ce, Sm, Er, Yb, Dy, Gd, Tm and Lu as an activator. For example, as one embodiment, europium ($Eu^{2+}$) ions may be mixed in a molar concentration of 0.01 to 10 with a starting salt, with respect to a divalent metal including alkaline earth metals.

In addition, in step (1) of the method of preparing the phosphor of the embodiment, the starting salt may include at least one flux selected from the group consisting of $NH_4Cl$, $KCl$, $MgCl_2$, $SrCl_2$, $BaCl_2$, $BaF_2$, $SrF_2$, $CaF_2$, $NH_4F$, $H_3BO_3$, $K_3PO_4$ and $KNO_3$.

The flux may be included in an amount of 1 wt % or more and less than 10 wt % based on the total mass of the starting salt.

Here, when the flux is included in an amount of 1 wt %, each compound is not sufficiently mixed and thereby reaction may be incompletely terminated, and, when the flux is included in an amount of 10 wt % or more, the flux functions as impurities in phosphors and thereby it is difficult to clean after reaction.

Subsequently, in step (2), the mixed starting salt may be heat treated at a sintering temperature of 1000° C. to 1600° C. under a reducing gas atmosphere supplied at a flow rate of 100 sccm to 1000 sccm.

Here, coloring efficiency is reduced when the sintering temperature is less than 1000° C., and color purity is reduced when the sintering temperature exceeds 1600° C. and, as such, a high quality phosphor may not be produced.

In step (2), the reducing gas atmosphere may be a reducing gas atmosphere formed by mixing nitrogen and hydrogen, and may be formed at normal pressure. For example, the mixed gas may be made of nitrogen and hydrogen in a mixing ratio of 95:5 to 90:10, In particular, sintering time depends on sintering temperature and a supply rate of the mixed gas, and coloring and efficiency of the phosphor may be controlled.

The preparation method may used in Formula 1 as well as Formula 2, but cations and anion added during a material addition process may be different in the formulas.

The bluish green phosphors having the composition formulas of Formulas 1 to 3 may be applied to a light emitting device package emitting white light due to light emission characteristics equal or superior to conventional phosphors and excellent temperature characteristics, by optimally combining ingredients of cations and anions in a SiON-based phosphor and optimizing a composition ratio thereof.

Hereinafter, one embodiment of a light emitting device package including the bluish green phosphor of the embodiment described above will be described in conjunction with figures.

One embodiment of a light emitting device package may include at least one light emitting device, and a molding part disposed on the at least one light emitting device and including a phosphor composition, wherein the phosphor composition may include the bluish green phosphor in the embodiment described above.

FIG. 6 illustrates one embodiment of the light emitting device package.

In FIG. 6, the light emitting device package may include a package body 100, a light emitting device 104 disposed on the package body 100, and a molding part 108 surrounding the light emitting device 104 and disposed on the package body 100. In the molding part 108, phosphor compositions 111, 112 and 113 including the bluish green phosphor in the embodiment described above may be disposed.

The package body 100 may be formed including a silicone material, a synthetic resin material, or a metal material, and may be made of a ceramic material having superior thermal conductivity.

The package body 100 may include a lead frame (not shown) to electrically connect to a light emitting device. When a lead frame is formed in the package body 100, the lead frame may be made of a conductive material such as copper and the like, and, for example, may be disposed after plating with gold (Au). The lead frame may reflect light emitted from the light emitting device 104.

In the light emitting device 104, a luminescence diode and the like may be disposed.

In one embodiment of the light emitting device package, at least one light emitting device 104 may be included.

The light emitting device may emit blue light or light in an ultraviolet (UV) wavelength area, and may be used as an excitation light source of a phosphor included in a phosphor layer.

In addition, the light emitting devices may emit light in different wavelength areas when a plurality of light emitting devices is included, and, for example, may include a red light emitting device or a green light emitting device.

The light emitting device 104 may be electrically connected to the package body 100 or the lead frame through wires 105 and 106.

The molding part 108 may be formed in a dome type, and may be disposed on the light emitting device.

The molding part 108 may be disposed in a different shape to control a light emission angle of the light emitting device package. The molding part 108 protects surrounding a light emitting device 104 and may function as a lens changing a path of light emitted from the light emitting device 104.

The molding part 108 may include a resin part, and the resin part may include a mixture including any one of a silicone-based resin, an epoxy-based resin and an acrylic resin, or may include a resin selected from the resins.

The light emitting device package (100) of the embodiment may include the bluish green phosphor in the embodiment described above.

Here, a content of the bluish green phosphor may be controlled according to a desired color coordinates and the bluish green phosphor may be included in 0.1 or more and 99 or less parts by weight based on 100 parts by weight of a silicone resin, an epoxy resin or an encapsulant.

The phosphor composition may further include any one of a green and yellow phosphor, and a red phosphor.

The green phosphor or the yellow phosphor may be $(Lu,Gd)_3(Al,Ga)_5O_{12}:Ce^{3+}$ or $(Y,Gd)_3(Al,Ga)_5O_{12}:Ce^{3+}$.

The red phosphor may be $(Sr,Ca)AlSiN_3:Eu^{2+}$ or $(Sr,Ba,Ca)_2Si_5N_8:Eu^{2+}$.

The light emitting device package of the embodiment described above including the bluish green phosphor may emit white light.

FIG. 7 illustrates a comparison result of light spectra of a light emitting device package using the bluish green phosphor and a commercially available white LED device at a color rendering index (CRI) of 90 under a color temperature basis of 5000 K.

For example, a bluish green phosphor included in the embodiment may have a composition of Formula 3 and may be any one selected from the group consisting of
$Ba_{2.84}Mg_{0.11}Si_{5.95}O_{3.4}N_{8.33}F_{0.22}K_{0.5}P_{0.1}Li_{0.2}:Eu_{0.15}$,
$Ba_{2.84}Mg_{0.11}Si_{5.9}O_{3.64}N_{7.93}F_{0.67}K_{0.48}P_{0.16}Li_{0.67}:Eu_{0.15}$,
$Ba_{0.84}Mg_{0.11}Si_{4.95}O_{2.395}N_{8.6}F_{0.32}K_{0.3}P_{0.1}Li_{0.1}:Eu_{0.15}$,
$Ba_{1.84}Mg_{0.11}Si_{4.95}O_{2.395}N_{8.6}F_{1.22}K_{0.3}P_{0.1}Li:Eu_{0.15}$,
$Ba_{2.79}Mg_{0.11}Si_6O_{3.62}N_8F_{0.66}K_{0.465}P_{0.155}Li_{0.66}:Eu_{0.15}$,
$Ba_{5.32}Mg_{0.53}Si_{12.1}O_{3.3}N_{8.2}F_{0.67}$ $K_{0.48}P_{0.16}Li_{0.67}:Eu_{0.15}$, and
$Ba_{11.55}Mg_{1.3}Si_{2.1}O_{5.3}N_{1.4}F_{0.67}K_{0.48}P_{0.16}Li_{0.67}:Eu_{0.15}$.

Referring to FIG. 7, the red graph may indicate a spectrum of a commercially available white LED device realizing a color rendering index (CRI) of 90 at a color temperature of 5000 K, and a blue graph may indicate a light spectrum of the white LED device prepared using the bluish green luminescence phosphor of the embodiment of the present invention.

For example, the bluish green phosphor included in the embodiment may have the composition of Formula 3 and may be any one selected from the group consisting of
$Ba_{2.84}Mg_{0.11}Si_{5.95}O_{3.4}N_{8.33}F_{0.22}K_{0.5}P_{0.1}Li_{0.2}:Eu_{0.15}$,
$Ba_{2.84}Mg_{0.11}Si_{5.9}O_{3.64}N_{7.93}F_{0.67}K_{0.48}P_{0.16}Li_{0.67}:Eu_{0.15}$,
$Ba_{1.84}Mg_{0.11}Si_{4.95}O_{2.395}N_{8.6}F_{0.32}K_{0.3}P_{0.1}Li_{0.1}:Eu_{0.15}$,
$Ba_{1.84}Mg_{0.11}Si_{4.95}O_{2.395}N_{8.6}F_{1.22}K_{0.3}P_{0.1}Li:Eu_{0.15}$,
$Ba_{2.79}Mg_{0.11}Si_6O_{3.62}N_8F_{0.66}K_{0.465}P_{0.155}Li_{0.66}:Eu_{0.15}$,
$Ba_{5.32}Mg_{0.53}Si_{12.1}O_{3.3}N_{8.2}F_{0.67}$ $K_{0.48}P_{0.16}Li_{0.67}:Eu_{0.15}$, and
$Ba_{11.55}Mg_{1.3}Si_{2.1}O_{5.3}N_{1.4}F_{0.67}K_{0.48}P_{0.16}Li_{0.67}:Eu_{0.15}$.

Referring to FIG. 7, in the white LED device including the phosphor of the embodiment, a spectrum of a red area is reduced and, as such, luminous intensity may be entirely improved.

FIG. 8 illustrates a light spectrum of the white LED device prepared using the bluish green phosphor of the embodiment at a color rendering index (CRI) of 80 under a color temperature basis of 5000 K. It can be confirmed that a light emitting area forms near 500 nm (Z) and thereby a color rendering index (CRI) is improved, and, accordingly, a device may realize white light.

For example, luminous intensity of a white LED device further including a green phosphor and a red phosphor with the bluish green phosphor by the composition of Formula 3 may be improved by approximately 10% while maintaining a color rendering index (CRI) equal to a commercially available white LED device.

Accordingly, the light emitting device package of the embodiment may have dramatically improved color rendering and luminous intensity while suppressing overuse of red phosphor ingredients, and, accordingly, light emitting strength may be increased.

In the light emitting device package of the embodiment, the light emitting device may emit light at blue wavelength area, and may be a 300 to 420 nm UV chip or a 420 to 480 nm blue chip.

The light emitting device emitting UV light or blue light is used as an excitation light source, and the light emitting device may be a GaN light emitting device.

The light emitting device package of the embodiment may include the green or yellow phosphor having a central luminescence wavelength of 510 to 570 nm, the red phosphor having a central luminescence wavelength of 610 to 670 nm, and the bluish green phosphor represented by each of composition formulas of Formulas 1 to 3 in the embodiments described above.

The bluish green phosphor of the embodiment may have a central luminescence wavelength area of 460 to 540 nm and an excitation wavelength of 300 to 490 nm.

For example, when a first embodiment includes a green or yellow phosphor having a central luminescence wavelength of 525 to 535 nm and a red phosphor having a central luminescence wavelength of 625 to 635 nm, a bluish green (BG) phosphor having each of the composition formulas of Formulas 1 to 3 may have a weight ratio as follows:

$$0 \text{ wt \%} < M < 50 \text{ wt \%}$$

wherein $M=\{mb/(mb+mg+mr)\}*100$, mb is the weight of the bluish green phosphor, mg is the weight of any one of the green and yellow phosphors, and mr is the weight of the red phosphor.

In addition, when a second embodiment of the light emitting device package includes a green or yellow phosphor having a central luminescence wavelength of 520 to 530 nm and a red phosphor having a central luminescence wavelength of 650 to 665 nm, a bluish green (BG)luminescence phosphor having each of the composition formulas of Formulas 1 to 3 may be included in a weight ratio below:

$$0 \text{ wt \%} < M < 20 \text{ wt \%}$$

wherein $M=\{mb/(mb+mg+mr)\}*100$, mb is the weight of the bluish green phosphor, mg is the weight of any one of the green and yellow phosphors, and mr is the weight of the red phosphor.

When a third embodiment of the light emitting device package includes a green or yellow phosphor having a central luminescence wavelength of 535 to 545 nm and a red phosphor having a central luminescence wavelength of 650 to 665 nm, a bluish green (BG) luminescence phosphor having each of composition formulas of Formulas 1 to 3 may be included in a weight ratio below:

$$0 \text{ wt \%} < M < 40 \text{ wt \%}$$

wherein $M=\{mb/(mb+mg+mr)\}*100$, mb is the weight of the bluish green phosphor, mg is the weight of any one of the green and yellow phosphors, and mr is the weight of the red phosphor.

In addition, in the third embodiment, when the weight ratio of the bluish green phosphor is 5 wt % to 35 wt %, a color rendering index (CRI) of a light emitting device package may be 90 Ra or more and 99 Ra or less.

By controlling the amount of the bluish green (BG) luminescence phosphor described in each of the first embodiment to third embodiment and using a large amount of bluish green color instead of red color having low luminous efficiency, the embodiment of the light emitting device package may realize a color rendering index (CRI) of 60 Ra or more and 99 Ra or less at a correlated color temperature (CCT) of 2,000 to 10,000 K.

In addition, the light emitting device package of the embodiment may have a light emitting spectrum having peak patterns such as a first peak at 440 to 460 nm, a second peak at 490 to 510 nm, a third peak at 530 to 540 nm and a fourth peak at 650 to 655 nm.

For example, the luminescence spectra illustrated in FIGS. 9, 11 and 13 are a luminescence spectrum of LED devices manufactured prepared by mixing a conventional green phosphor and red phosphor, without a bluish green phosphor.

For example, FIG. 9 may be a light emitting spectrum of a light emitting device package which is formed by removing a bluish green phosphor from the first embodiment, FIG. 11 may be a light emitting spectrum of a light emitting device package which is formed by removing a bluish green phosphor from the second embodiment, and FIG. 13 may be a light emitting spectrum of a light emitting device package which is formed by removing a bluish green phosphor from the third embodiment.

On the other hand, in FIGS. 10, 12 and 14, it can be confirmed that a light emitting spectrum of a light emitting device package including a bluish green phosphor as described in the first embodiment and third embodiment has a peak pattern such as a first peak at 440 to 460 nm, a second peak at 490 to 510 nm, a third peak at 530 to 540 nm, and a fourth peak at 650 to 655 nm.

For example, FIG. 10 may be a light emitting spectrum of the light emitting device package of the first embodiment, FIG. 12 may be a light emitting spectrum of the light emitting device package of the second embodiment, and FIG. 14 may be a light emitting spectrum of the light emitting device package of the third embodiment.

In the embodiment of the light emitting device package described above, a color rendering index (CRI) of 65 or more and 98 or less is maintained at a correlated color temperature (CCT) of 2700 to 6500 K, and improved luminous intensity characteristics may be exhibited.

For example, the embodiment of the light emitting device package includes an LED package which is manufactured in a dispersive type that a green phosphor, a red phosphor and a bluish green luminescence phosphor are dispersed in a light emitting device; a conformal type; or a remote type.

Here, FIG. 15 is a schematic diagram of a white LED device manufactured in a dispersive type, in which a phosphor is dispersed over a light emitting device, and the white LED device is manufactured using a conventional method.

FIG. 16 illustrates one embodiment of a light emitting device package in which a phosphor composition is coated over a light emitting device in a conformal type. Here, the phosphor may be formed adjacent to the light emitting device.

FIG. 17 illustrates one embodiment of a phosphor disposed in a remote type. In the embodiment of FIG. 17, the phosphor layer of a remote type may be made of a plate of a ceramic, a polymer, phosphor in glass (PIG), or the like.

As illustrated in FIG. 18, another embodiment of the light emitting device package may be formed by hardening after spreading a phosphor composition over a light emitting device in a spray manner.

The light emitting device package of the embodiment described above may be included as a light source of a lighting apparatus.

The light emitting device packages of the embodiments have superior luminance and color rendering, and thereby may be used as a light source in an electronic component selected from the group consisting of camera flashes, laptops, mobile phones, smart phones, back light units for TV, and displays.

Alternatively, the light emitting device packages of the embodiments may be included in headlamps for vehicles, interior lights, outdoor lights, streetlights, electric sign lights, lights for electronic scoreboards, light sources for pharmaceutical purposes, light sources for exhibition areas, agricultural light sources, and the like.

Hereinafter, the present invention will be described in more detail in conjunction with examples below.

Examples below are intended to more particularly explain the present invention and the present invention should not be limited to the examples.

<Example 1> Preparation of Bluish Green Phosphor and Property Evaluation

Each of starting salts Such as $BaCO_3$, $Si_3N_4$, $Eu_2O_3$ and the like was quantified and then was put into a ball mill container. Subsequently, the starting salt was ball-milled for 8 to 24 hours using isopropyl alcohol as a solvent and then was dried. Subsequently, a dried starting salt was sintered for 3 hours at 1300□ temperature under a reducing atmosphere in which hydrogen gas was supplied at a flow rate of 100 sccm, resulting in preparation of a phosphor. Here, a flux was used.

Example 1 relates to preparation of a bluish green phosphor represented by a formula of $Ba_aSi_bO_cN_dG_e:Eu_h$. In the formula, G is any one of C, Cl, F and Br elements, $0 < a \leq 15$, $0 < b \leq 15$, $0 < c \leq 15$, $0 < d \leq 20$, $0 < e \leq 10$ and $0 < h \leq 10$.

In Tables 1 to 4 below, optical characteristics according to element C type and the amount of element C in the formula are summarized.

TABLE 1

| Ratio | Composition $0.01 \leq e \leq 0.1$ | Luminance (Brightness, %) | Central wavelength (nm) | Full width at half maximum (nm) | Color Coordinates (Cx, Cy) |
|---|---|---|---|---|---|
| C = 0.01 | $Ba_{2.9}Si_6O_3N_8C_{0.01}:Eu_{0.1}$ | 100 | 495 | 30 | 0.068, 0.480 |
| C = 0.1 | $Ba_{2.9}Si_6O_3N_8C_{0.1}:Eu_{0.1}$ | 97 | 495 | 30 | 0.068, 0.489 |
| C = 1 | $Ba_{2.9}Si_6O_3N_8C_1:Eu_{0.1}$ | 95 | 495 | 30 | 0.068, 0.478 |
| C = 5 | $Ba_{2.9}Si_6O_3N_8C_5:Eu_{0.1}$ | 87 | 495 | 31 | 0.068, 0.477 |
| C = 10 | $Ba_{2.9}Si_6O_3N_8C_{10}:Eu_{0.1}$ | 70 | 495 | 33 | 0.068, 0.473 |

TABLE 2

| Ratio | Composition $0.01 \leq e \leq 0.1$ | Luminance (Brightness, %) | Central wavelength (nm) | Full width at half maximum (nm) | Color coordinates (Cx, Cy) |
|---|---|---|---|---|---|
| F = 0.01 | $Ba_{2.9}Si_6O_3N_8F_{0.01}:Eu_{0.1}$ | 100 | 495 | 30 | 0.068, 0.480 |
| F = 0.1 | $Ba_{2.9}Si_6O_3N_8F_{0.1}:Eu_{0.1}$ | 99 | 495 | 30 | 0.068, 0.479 |
| F = 1 | $Ba_{2.9}Si_6O_3N_8F_1:Eu_{0.1}$ | 98 | 496 | 30 | 0.069, 0.480 |
| F = 5 | $Ba_{2.9}Si_6O_3N_8F_5:Eu_{0.1}$ | 95 | 496 | 30 | 0.069, 0.478 |
| F = 10 | $Ba_{2.9}Si_6O_3N_8F_{10}:Eu_{0.1}$ | 92 | 495 | 30 | 0.068, 0.478 |

TABLE 3

| Ratio | Composition $0.01 \leq e \leq 0.1$ | Luminance (Brightness, %) | Central wavelength (nm) | Full width at half maximum (nm) | Color coordinates (Cx, Cy) |
|---|---|---|---|---|---|
| Cl = 0.01 | $Ba_{2.9}Si_6O_3N_8Cl_{0.01}:Eu_{0.1}$ | 100 | 495 | 30 | 0.068, 0.480 |
| Cl = 0.1 | $Ba_{2.9}Si_6O_3N_8Cl_{0.1}:Eu_{0.1}$ | 97 | 495 | 30 | 0.069, 0.479 |
| Cl = 1 | $Ba_{2.9}Si_6O_3N_8Cl_1:Eu_{0.1}$ | 99 | 496 | 30 | 0.069, 0.480 |
| Cl = 5 | $Ba_{2.9}Si_6O_3N_8Cl_5:Eu_{0.1}$ | 97 | 495 | 30 | 0.069, 0.479 |
| Cl = 10 | $Ba_{2.9}Si_6O_3N_8Cl_{10}:Eu_{0.1}$ | 95 | 494 | 30 | 0.068, 0.479 |

TABLE 4

| Ratio | Composition $0.01 \leq e \leq 10$ | Luminance (Brightness, %) | Central wavelength (nm) | Full width at half maximum (nm) | Color coordinates (Cx, Cy) |
|---|---|---|---|---|---|
| Br = 0.01 | $Ba_{2.9}Si_6O_3N_8Br_{0.01}:Eu_{0.1}$ | 100 | 495 | 30 | 0.068, 0.480 |
| Br = 0.1 | $Ba_{2.9}Si_6O_3N_8Br_{0.1}:Eu_{0.1}$ | 93 | 495 | 30 | 0.068, 0.479 |
| Br = 1 | $Ba_{2.9}Si_6O_3N_8Br_1:Eu_{0.1}$ | 90 | 494 | 30 | 0.069, 0.478 |
| Br = 5 | $Ba_{2.9}Si_6O_3N_8Br_5:Eu_{0.1}$ | 82 | 492 | 32 | 0.067, 0.476 |
| Br = 10 | $Ba_{2.9}Si_6O_3N_8Br_{10}:Eu_{0.1}$ | 65 | 491 | 34 | 0.066, 0.472 |

Referring to phosphor property evaluation results of Tables 1 to 4, it can be confirmed that the phosphors of the prepared embodiments use a wavelength of 300 to 500 nm as an excitation source, emit a luminescence wavelength of 460 to 540 nm, and have a central luminescence wavelength of 490 to 500 nm.

Table 5 shows light characteristics of embodiments when, in $Ba_aSi_bO_cN_dF_e:Eu_h$, satisfies $0<a\leq15$. In the composition formula, b may satisfy $5\leq b\leq15$, c may satisfy $2\leq c\leq7$, d may satisfy $5\leq d\leq20$, e may satisfy $0<e\leq1$, and h may satisfy $0<h\leq1$.

For example, in Examples 1-1 to 1-4, only the amount of Ba is varied and the amounts of the other ingredients are fixed.

TABLE 5

| Classification | Central luminescence wavelength(nm) | Luminous intensity | Full width at half maximum (nm) |
|---|---|---|---|
| Example 1-1 | 495.6 | 33.3 | 30.6 |
| Example 1-2 | 495.6 | 34.4 | 30.6 |
| Example 1-3 | 495.6 | 34.1 | 30.6 |
| Example 1-4 | 495.6 | 31.3 | 30.6 |

Referring to Table 5, it can be confirmed that a bluish green phosphor having superior luminous intensity may be realized when, in the embodiment of the bluish green phosphor, a molar ratio of Ba, namely, a, satisfies $0<a\leq15$.

<Example 2> Preparation of Bluish Green Phosphor and Property Evaluation

Phosphors were prepared in the same manner as in Example 1 except that $BaCO_3$, $MgF_2$, $Si_3N_4$, $Eu_2O_3$, and $K_3PO_4$ disclosed in Table 6 below were used.

Properties of the prepared phosphors are summarized in Table 6 below.

Table 6 shows light properties of bluish green phosphors prepared by varying composition ratios of K and P with respect to embodiments represented by Formula 2.

In Table 6, luminous intensity means a luminescence peak area in a luminescence spectrum and may correspond to a measured total light emitting amount of a phosphor.

TABLE 6

| Classification | Central luminescence wavelength(nm) | Luminous intensity | Full width at half maximum (nm) |
|---|---|---|---|
| Examples 2-1 | 493.6 | 19.0 | 31.4 |
| Examples 2-2 | 494.6 | 30.2 | 31.4 |
| Examples 2-3 | 495.6 | 36 | 31.0 |
| Examples 2-4 | 495.6 | 36.8 | 31.2 |
| Examples 2-5 | 496.6 | 28.7 | 32.0 |
| Examples 2-6 | 496.6 | 29.8 | 31.4 |

Embodiments shown in Table 6 may be represented by a composition of Formula 2, and, for example, shows light characteristic values measured after controlling the amounts of K and P and fixing the amounts of the other ingredients in a composition formula of $Ba_xMg_ySi_bO_cN_dF_eK_wP_z:Eu_h$.

For example, the embodiments of Table 6 may satisfy $0.5<x\leq15$, $0<y\leq10$, $0.5<x+y\leq15$, $5\leq b\leq15$, $2\leq c\leq7$, $5\leq d\leq20$, $0<e\leq1$, and $0<h\leq1$ in $Ba_xMg_ySi_bO_cN_dF_eK_wP_z:Eu_h$.

Referring to Table 6, a molar ratio of K may be greater than 0 and 6 or less, and a molar ratio of P may be greater than 0 and 2 or less in Formula 2.

For example, a molar ratio of K, namely, w, may satisfy $0<w\leq6$ and, in particular, $0.2\leq w\leq0.6$.

FIG. 1 illustrates luminescence wavelength characteristics of bluish green phosphors having the composition formulas of the embodiments of Table 6.

Referring to Table 6 and FIG. 1, it can be confirmed that luminous intensity changes according to the amount of K and, when the amount of K is 0.6 mol or less, a luminous intensity value increases with increasing amount of K, but, when a molar ratio of K is greater than 0.6, luminous intensity reduction increases.

In addition, referring to FIG. 1, it can be confirmed that the embodiments have bluish green luminescence characteristics at a central luminescence wavelength of 490 nm to 500 nm.

As confirmed in Table 6, a bluish green luminescence phosphor having a central luminescence wavelength of 492 to 495 nm was prepared, and, by adding K, lattice coupling of the bluish green phosphor becomes stronger and, as such, the bluish green phosphor of the embodiment may have improved light characteristics and thermal stability.

However, when a molar ratio of K is greater than 6, K may function as impurities in a phosphor composition and, as such, light characteristics may be reduced.

<Example 3> Preparation of Bluish Green Phosphor and Property Evaluation

Phosphors were prepared in the same manner as in Example 1, except that $BaCO_3$, $MgF_2$, $Si_3N_4$, $Eu_2O_3$, $K_3PO_4$ and LIF disclosed in Table 7 below were used.

Table 7 shows properties of prepared phosphors having a composition ratio of Formula 2.

Table 7 shows light properties of bluish green phosphors in which the amounts of Li and F are varied with respect to embodiments represented by Formula 3.

In Table 7, luminous intensity indicates a luminescence peak area in a luminescence spectrum and may correspond to measured total light emission of a phosphor.

TABLE 7

| Classification | Central luminescence wavelength (nm) | Luminous intensity | Full width at half maximum (nm) |
|---|---|---|---|
| Example 3-1 | 494.6 | 38.4 | 31.4 |
| Example 3-2 | 494.6 | 39.2 | 31.4 |
| Example 3-3 | 495.6 | 39.6 | 31.4 |
| Example 3-4 | 496.6 | 40.7 | 31.6 |
| Example 3-5 | 495.6 | 37.7 | 31.4 |
| Example 3-6 | 494.6 | 34.7 | 31.4 |
| Example 3-7 | 494.6 | 30.3 | 31.4 |
| Example 3-8 | 494.6 | 25.5 | 31.4 |
| Example 3-9 | 494.6 | 19.2 | 31.4 |

Table 7 shows light characteristic values measured after controlling the amount of Li and F in the composition formula represented by Formula 3. The light characteristic values of the embodiments of Table 7 may be measured by controlling the amounts of Li and F and fixing the amounts of the other ingredients.

For example, a composition of Formula 3 as an embodiment of Table 7 may be $Ba_xMg_ySi_bO_cN_dF_eK_wP_zLi_v:Eu_h$, where $0.5<x\leq15$, $0<y\leq10$, $0<x+y\leq15$, $5\leq b\leq15$, $2\leq c\leq7$, $5\leq d\leq20$, $0\leq e\leq1$, $0<h\leq1$, $0<w\leq6$, and $0<z\leq2$.

Referring to Table 7, a molar ratio of Li may be greater than 0 and 6 or less, and a molar ratio of F may be greater than 0 and 6 or less in Formula 3.

For example, a molar ratio of Li, namely, v, may satisfy 0<v≤6, particularly, 0<v≤1.4.

FIG. 2 illustrates luminescence wavelength characteristics of bluish green phosphors having the composition formulas of the embodiments of Table 7.

Referring to Table 7 and FIG. 2, it can be confirmed that luminous intensity changes according to the amounts of Li and F and, when the amount of LiF is 1.4 mol or less, a luminous intensity value increases with increasing amount of LiF, but, when a molar ratio of LiF is greater than 1.4, luminous intensity reduction increases.

In addition, referring to FIG. 2, it can be confirmed that the embodiments have bluish green luminescence characteristics at a central luminescence wavelength of 490 nm to 500 nm.

As confirmed in Table 7, a bluish green luminescence phosphor having a central luminescence wavelength of 492 to 495 nm, and, by adding Li, lattice coupling of the bluish green phosphor becomes stronger and, as such, the bluish green phosphor of the embodiment may have improved light characteristics and thermal stability.

However, when LiF is included in a molar ratio of greater than 6, LiF functions as impurities in the phosphor composition and, as such, light properties may be deteriorated.

<Experimental Example 1> Particle Size Distribution (PSA) Measurement of Phosphors FIG. 3 illustrates particle size distribution (PSA) of the bluish green luminescence phosphor of the present invention. Here, a $Ba_{5.32}Mg_{0.53}Si_{12.1}O_{3.3}N_{8.2}F_{0.67}K_{0.48}P_{0.16}Li_{0.67}:Eu_{0.15}$ bluish green phosphor was used and specific results are summarized in Table 8 below.

TABLE 8

| % Tile | Particle sizes (μm) |
|---|---|
| 10.00 | 8.52 |
| 20.00 | 10.81 |
| 30.00 | 12.59 |
| 40.00 | 14.20 |
| 50.00 | 15.81 |
| 60.00 | 17.56 |
| 70.00 | 19.66 |
| 80.00 | 22.53 |
| 90.00 | 22.72 |
| 100.00 | 73.41 |

From the results, it can be confirmed that the bluish green phosphor according to the present invention has a D10 particle size distribution (PSA) of 1 μm or more and less than 10 μm, a D20 particle size distribution (PSA) of 5 μm or more and less than 15 μm, a D30 particle size distribution (PSA) of 10 μm or more and less than 20 μm, a D40 particle size distribution (PSA) of 10 μm or more and less than 25 μm, a D50 particle size distribution (PSA) of 10 μm or more and less than 30 μm, a D60 particle size distribution (PSA) of 15 μm or more and less than 30 μm, a D70 particle size distribution (PSA) of 15 μm or more and less than 35 μm, a D80 particle size distribution (PSA) of 20 μm or more and less than 40 μm, a D90 particle size distribution (PSA) of 20 μm or more and less than 70 μm, and a D100 particle size distribution (PSA) of 25 μm or more and less than 100 μm.

<Experimental Example 2> EDX Analysis of Phosphors

The bluish green luminescence phosphor of the present invention was analyzed using an energy dispersive spectrometry (EDX) (Thermo, Noran).

As results of EDX analysis, Wt % and At % of ingredients included in the bluish green luminescence phosphor of the present invention are summarized in Table 9 below.

TABLE 9

| Element | Wt % | Particle sizes (μm) |
|---|---|---|
| N | 3.91 | 14.81 |
| O | 5.2 | 17.28 |
| F | 1.11 | 3.11 |
| Mg | 1.45 | 3.18 |
| Si | 17.2 | 32.53 |
| Ba | 66.1 | 25.57 |
| Eu | 2.12 | 0.74 |
| K | 1.02 | 1.60 |
| P | 0.56 | 0.55 |
| Li | 1.2 | 0.62 |

As shown in Table 9, when the bluish green luminescence phosphor of the present invention was quantitatively analyzed through X-ray fluorescence analysis, presence of Ba, Mg, Si, O, N, F, Eu, K, P, Li elements was confirmed. More particularly, it can be confirmed that a phosphor, where 20≤Ba≤35, 1≤Mg≤10, 25≤Si≤45, 10≤O≤20, 10≤N≤20, 1≤F≤10 and 0.1≤Eu≤5 with respect to At % of each element, and a total At % of elements is 100, was prepared.

<Example 3> Light Emitting Device Package Including Bluish Green (BG) Phosphor Having a Composition of Formula 1

<Examples 3-1 to 3-4> Manufacture of White LED Device as First Embodiment

A phosphor composition included in a light emitting device package as a first embodiment may include a LuAG-based phosphor, namely, $(Lu,Gd)_3(Al,Ga)_5O_{12}:Ce^{3+}$, having a central luminescence wavelength of 525 to 535 nm as a green phosphor, $(Sr,Ca)AlSiN_3:Eu^{2+}$ having a central luminescence wavelength of 625 to 635 nm as a red phosphor, and a bluish green phosphor (BG) according to Formula 3.

In the bluish green phosphor (BG) according to Formula 3, B may be Si, G may be F, and RE may be Eu.

After mixing the green phosphor, the red phosphor and the bluish green phosphor of the embodiment in ratios disclosed in Table 10, the mixture was coated or disposed as a thin layer on a light emitting device emitting ultraviolet or blue light as an excitation source and then was fixed by hardening for 1 hour at 100 to 160° C.

Comparative Examples 1 to 2

Light emitting device packages of comparative examples were manufactured in the same manner as in Examples 3-1 to 3-4, except that phosphors were mixed in ratios disclosed in Table 10 below.

TABLE 10

| | Phosphor ratios | | | |
|---|---|---|---|---|
| Classification | BG | LuAG-1 (525 nm to 535 nm) | (Sr, Ca)AlSiN3-1 (625 nm to 635 nm) | Total (%) |
| Comparative Example 1 | 0 | 90 | 10 | 100 |
| Example 3-1 | 5 | 85 | 10 | 100 |
| Example 3-2 | 10 | 80 | 10 | 100 |

TABLE 10-continued

| Classification | Phosphor ratios | | | |
|---|---|---|---|---|
| | BG | LuAG-1 (525 nm to 535 nm) | (Sr, Ca)AlSiN3-1 (625 nm to 635 nm) | Total (%) |
| Example 3-3 | 15 | 75 | 10 | 100 |
| Example 3-4 | 20 | 70 | 10 | 100 |
| Comparative Example 2 | 25 | 65 | 10 | 100 |

<Examples 3-5 to 3-6> Manufacture of Light Emitting Device Packages as Second Embodiment A phosphor composition included in a light emitting device package as a second embodiment may include a LuAG-based phosphor, namely, $(Lu,Gd)_3(Al,Ga)_5O_{12}:Ce^{3+}$, having a central luminescence wavelength of 520 to 530 nm as a green phosphor, $(Sr,Ca)AlSiN_3:Eu^{2+}$ having a central luminescence wavelength of 650 to 665 nm as a red phosphor, and a bluish green phosphor (BG) having a composition of Formula 3.

In the bluish green phosphor (BG) according to Formula 3, B may be Si, G may be F, and RE may be Eu.

After mixing the green phosphor, the red phosphor and the bluish green phosphor in ratios disclosed in Table 11, the mixture was coated or disposed as a thin layer on a light emitting device emitting ultraviolet or blue light as an excitation source and then was fixed by hardening for 1 hour at 100 to 160° C.

Comparative Example 3

A light emitting device package of a comparative example was manufactured in the same manner as in Examples 3-5 to 3-6, except that phosphors were mixed in ratios disclosed in Table 11 below.

TABLE 11

| Classification | phosphor ratios | | | |
|---|---|---|---|---|
| | BG | LuAG-2 (520 nm to 530 nm) | (Sr, Ca)AlSiN3-2 (650 nm to 665 nm) | Total (%) |
| Comparative Example 3 | 0 | 90 | 10 | 100 |
| Example 3-5 | 5 | 85 | 10 | 100 |
| Example 3-6 | 10 | 80 | 10 | 100 |

<Examples 3-7 to 3-10> Manufacture of Light Emitting Device Packages as Third Embodiment A phosphor composition included in a light emitting device package as a third embodiment may include a LuAG-based phosphor, namely, $(Lu,Gd)_3(Al,Ga)_5O_{12}:Ce^{3+}$, having a central luminescence wavelength of 535 to 545 nm as a green phosphor, $(Sr,Ca)AlSiN_3:Eu^{2+}$ having a central luminescence wavelength of 650 to 665 nm as a red phosphor, and one embodiment of a bluish green phosphor (BG) having a composition of Formula 3.

In the bluish green phosphor (BG) according to Formula 3, B may be Si, G may be F, and RE may be Eu.

After mixing the green phosphor, the red phosphor and the bluish green phosphor in ratios disclosed in Table 12, the mixture was coated or disposed as a thin layer type on a light emitting device emitting ultraviolet or blue light as an excitation source and then was fixed by hardening for 1 hour at 100 to 160° C.

Comparative Example 4

A light emitting device package of a comparative example was manufactured in the same manner as in Examples 3-7 to 3-10, except that phosphors were mixed in ratios disclosed in Table 12 below.

TABLE 12

| Classification | Phosphor ratios | | | |
|---|---|---|---|---|
| | BG | LuAG-3 (535 nm to 545 nm) | (Sr, Ca)AlSiN3-3 (650 nm to 665 nm) | Total (%) |
| Comparative Example 4 | 0 | 90 | 10 | 100 |
| Example 3-7 | 5 | 85 | 10 | 100 |
| Example 3-8 | 10 | 80 | 10 | 100 |
| Example 3-9 | 15 | 75 | 10 | 100 |
| Example 3-10 | 20 | 70 | 10 | 100 |

<Experimental Example 1> Measurement of Color Rendering Indexes (CRI)

Color rendering indexes (CRI) of the light emitting device packages emitting white color manufactured above and a commercially available LED device were measured.

Color rendering index (CRI) is a quantitative measure of the ability of a light source to reveal the colors of various objects faithfully in comparison with an ideal light source. The color rendering index is preferably as close as possible to 100. Results are summarized in Tables 13 to 15.

TABLE 13

| Classification | Light characteristics of packages | | | | |
|---|---|---|---|---|---|
| | CIEx | CIEy | Lm | CRI | CCT |
| Comparative Example 1 | 0.3485 | 0.3521 | 41.6 | 84.7 | 4878 |
| Example 3-1 | 0.3708 | 0.4068 | 42.3 | 86.4 | 4447 |
| Example 3-2 | 0.3546 | 0.3755 | 40.1 | 87.5 | 4767 |
| Example 3-3 | 0.3653 | 0.3939 | 40.8 | 89.1 | 4531 |
| Example 3-4 | 0.3418 | 0.3681 | 38.4 | 94.4 | 5174 |
| Comparative Example 2 | 0.3837 | 0.4464 | 38.2 | 83.4 | 4330 |

TABLE 14

| Classification | Light characteristics of packages | | | | |
|---|---|---|---|---|---|
| | CIEx | CIEy | Lm | CRI | CCT |
| Comparative Example 3 | 0.3704 | 0.3039 | 22.4 | 64.9 | 3620 |
| Example 3-5 | 0.3728 | 0.3106 | 23.63 | 73.6 | 3610 |
| Example 3-6 | 0.375 | 0.3005 | 24.5 | 79 | 3400 |

TABLE 15

| Classification | Light characteristics of packages | | | | |
|---|---|---|---|---|---|
| | CIEx | CIEy | Lm | CRI | CCT |
| Comparative Example 4 | 0.3425 | 0.3489 | 29.2 | 90.8 | 5127 |
| Example 3-7 | 0.3539 | 0.3652 | 30.5 | 93.1 | 4762 |
| Example 3-8 | 0.3625 | 0.3725 | 32.8 | 95.2 | 4506 |
| Example 3-9 | 0.3525 | 0.3691 | 29.9 | 98.5 | 4813 |
| Example 3-10 | 0.3418 | 0.3684 | 38.4 | 94.4 | 5174 |

As confirmed in Tables 13 to 15, the amount of a bluish green (BG) luminescence phosphor may be controlled per green phosphor and red phosphor luminescence wavelength areas, and, the most preferably, when the bluish green (BG) luminescence phosphor having the composition of Formula 3 is included in an amount of 10 to 15 wt % in the third embodiment, a color rendering index (CRT) of 95 Ra or more and 99 Ra or less is realized and a light emitting device package emitting white light may be provided.

In addition, the light emitting device packages of the embodiments exhibit dramatically increased color rendering index (CRT), when compared to the light emitting device packages manufactured according to conventional green phosphor and red phosphor combinations (Comparative Examples 1 to 4).

The white LED device of the present invention may realize a color rendering index (CRT) of 60 Ra or more and 99 Ra or less at a correlated color temperature (CCT) of 2,000 to 10,000 K by controlling a content of a bluish green phosphor as described in the first embodiment to third embodiment and mixing a large amount of a bluish green, instead of red which lowers luminous efficiency.

Accordingly, a light emitting device package emitting white light using the bluish green phosphor of the embodiment according to the present invention suppresses excessive use of a red phosphor ingredient and reduces efficiency reduction in some of other phosphors by a red phosphor, and thereby luminous intensity is improved and color rendering increases, and, accordingly, luminescence efficiency may be increased.

INDUSTRIAL APPLICABILITY

A bluish green phosphor according to the embodiment of the present invention and a light emitting device package using the same are applicable to a display apparatus, a lighting apparatus and the like and may exhibit improved luminance and color rendering index.

The invention claimed is:

1. A bluish green phosphor represented by Formula 3 below:

$$Ba_xMg_ySi_bO_cN_dF_eK_wP_zLi_v:Eu_h \qquad [\text{Formula 3}]$$

wherein $0.5 < x \leq 15$, $0 < y \leq 10$, $0.5 < x+y \leq 15$, $5 \leq b \leq 15$, $2 \leq c \leq 7$, $5 \leq d \leq 20$, $0 < e \leq 1$, $0 < h \leq 1$, $0 < w \leq 6$, $0 < v \leq 6$ and $0 < z \leq 2$.

2. The bluish green phosphor according to claim 1, wherein the bluish green phosphor uses a wavelength area of 300 to 500 nm as an excitation source and has a luminescence wavelength of 460 to 540 nm.

3. The bluish green phosphor according to claim 2, wherein a central wavelength of the luminescence wavelength is 490 nm to 500 nm.

4. The bluish green phosphor according to claim 1, wherein the bluish green phosphor particle has a D10 size distribution of 1 μm or more and less than 10 μm at D10, a D50 size distribution of 10 μm or more and less than 30 μm, and a D90 size distribution of 20 μm or more and less than 70 μm.

5. The bluish green phosphor according to claim 1, wherein v satisfies $0 < v \leq 1.4$.

6. A light emitting device package comprising:
at least one light emitting device emits light of an ultraviolet wavelength area or a blue light wavelength area; and
a molding part disposed on the at least one light emitting device and comprising a phosphor composition,
wherein the phosphor composition comprises the bluish green phosphor according to claim 1.

* * * * *